(12) United States Patent
Hayashi et al.

(10) Patent No.: US 8,125,069 B2
(45) Date of Patent: Feb. 28, 2012

(54) SEMICONDUCTOR DEVICE AND ETCHING APPARATUS

(75) Inventors: Toshio Hayashi, Shizuoka (JP);
Yasuhiro Morikawa, Shizuoka (JP);
Michio Ishikawa, Shizuoka (JP); Yuji Furumura, Tokyo (JP); Naomi Mura, Tokyo (JP)

(73) Assignee: Philtech Inc., Tokyo (JP)

( * ) Notice: Subject to any disclaimer, the term of this patent is extended or adjusted under 35 U.S.C. 154(b) by 0 days.

(21) Appl. No.: 12/830,995

(22) Filed: Jul. 6, 2010

(65) Prior Publication Data

US 2010/0270654 A1  Oct. 28, 2010

Related U.S. Application Data

(63) Continuation of application No. 11/664,091, filed as application No. PCT/JP2006/307499 on Apr. 7, 2006, now abandoned.

(51) Int. Cl.
*H01L 23/48* (2006.01)

(52) U.S. Cl. ............... 257/689; 257/684; 257/E21.252

(58) Field of Classification Search ............... 257/684, 257/685, 689, E21.252, E21.255
See application file for complete search history.

(56) References Cited

U.S. PATENT DOCUMENTS

| | | | | |
|---|---|---|---|---|
| 4,868,014 A | * | 9/1989 | Kanai et al. | 427/248.1 |
| 5,591,492 A | * | 1/1997 | Hirai et al. | 427/563 |
| 6,177,147 B1 | * | 1/2001 | Samukawa et al. | 427/569 |
| 2004/0217086 A1 | * | 11/2004 | Kawashima | 216/41 |
| 2005/0214694 A1 | | 9/2005 | Hong et al. | |

FOREIGN PATENT DOCUMENTS

| | | |
|---|---|---|
| JP | 11-031678 | 2/1999 |
| JP | 2002-289594 A | 10/2002 |
| JP | 2004-152862 A | 5/2004 |
| JP | 2005-072518 A | 3/2005 |
| JP | 2005-251814 | 9/2005 |
| JP | 2005-268321 A | 9/2005 |
| JP | 2006-032568 A | 2/2006 |
| KR | 2005-58916 A | 6/2005 |

(Continued)

OTHER PUBLICATIONS

Yasuhiro Morikawa, et al., "*Present Status and Problem of Striation-free technology of ArF resists and the Future Progress of the NLD etching apparatus*", ULVAC Technical Journal, 2005, No. 62, pp. 5-9.

(Continued)

*Primary Examiner* — Phuc Dang
(74) *Attorney, Agent, or Firm* — Arent Fox LLP

(57) ABSTRACT

A method for manufacturing a semiconductor device comprises dry-etching a thin film using a resist mask carrying patterns in which at least one of the width of each pattern and the space between neighboring two patterns ranges from 32 to 130 nm using a halogenated carbon-containing compound gas with the halogen being at least two members selected from the group consisting of F, I and Br. The ratio of at least one of I and Br is not more than 26% of the total amount of the halogen atoms as expressed in terms of the atomic compositional ratio to transfer the patterns onto the thin film. Such etching of a thin film avoids causing damage to the resist mask used. The resulting thin film carrying the transferred patterns is used as a mask for subjecting the underlying material to dry-etching.

9 Claims, 16 Drawing Sheets

FOREIGN PATENT DOCUMENTS

WO 02/39494 A1 5/2002

OTHER PUBLICATIONS

Yasuhiro Morikawa, et al., "*Present Status and Problem of Striation-free technology of ArF resists and the Future Progress of the NLD etching apparatus*", Semiconductor FPD World, Nov. 2004, pp. 82-85.

Yashiro Morikawa, et al., "*Etching characteristics of porous silica (k=1.9) in neutral loop discharge plasma, Journal of Vacuum Science & Technology*". B. Microelectronics and Nanometer Structures, 2003, vol. 21, No. 4, pp. 1344-1349.

Simon Karecki, et al., Characterization of iodoheptafluoropropane as a dielectric etachant. I. process performance evaluation, Journal of Vacuum, 2001, No. 19, vol. 4, pp. 1269-1291.

* cited by examiner

FIG.8
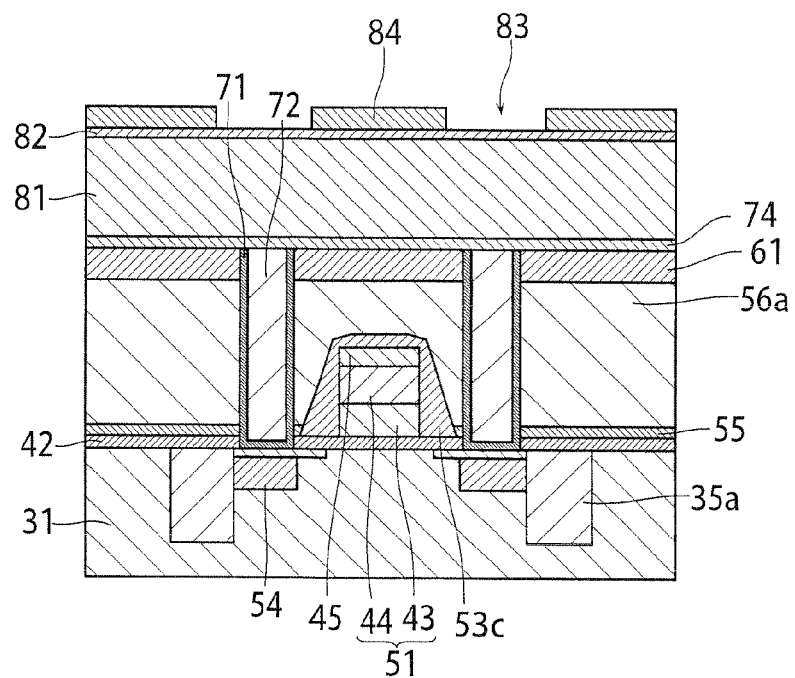
a)
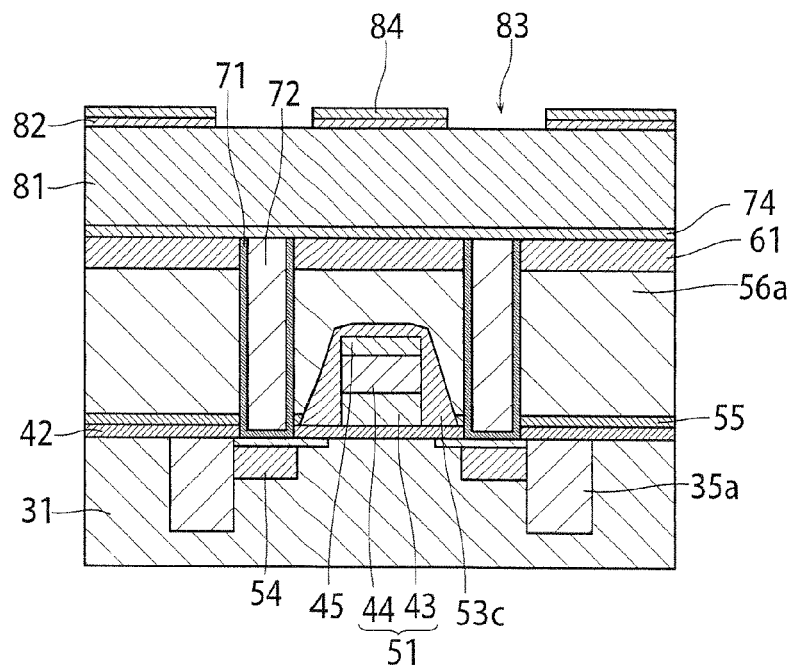
b)

FIG. 9
a)
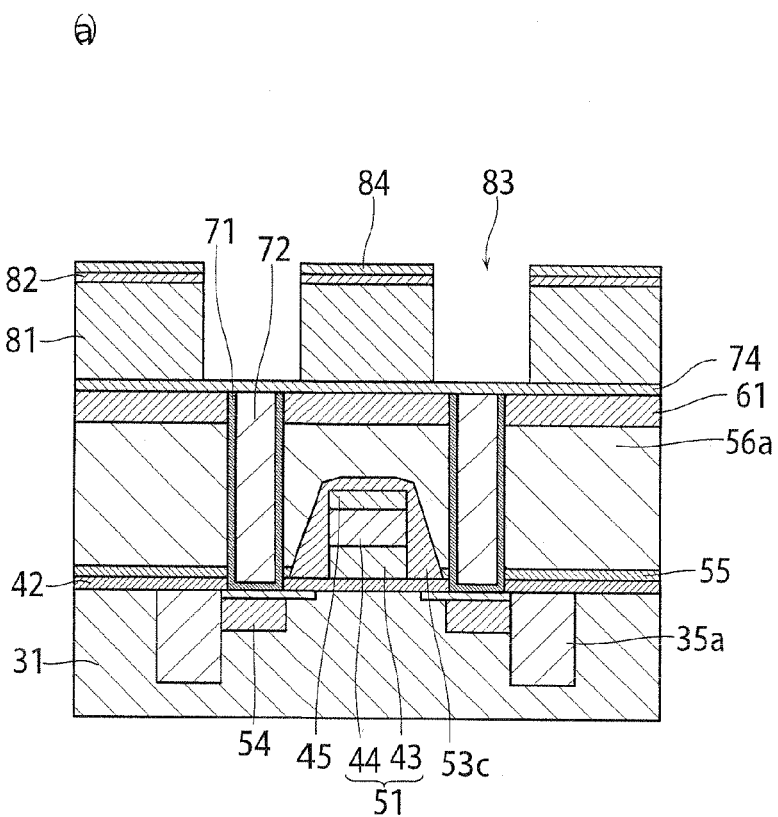
b)
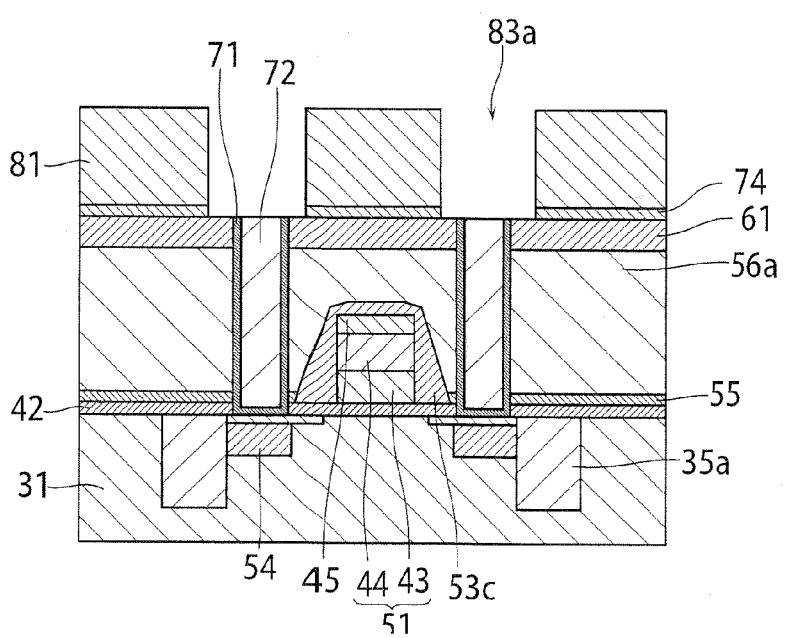

FIG.10
a)
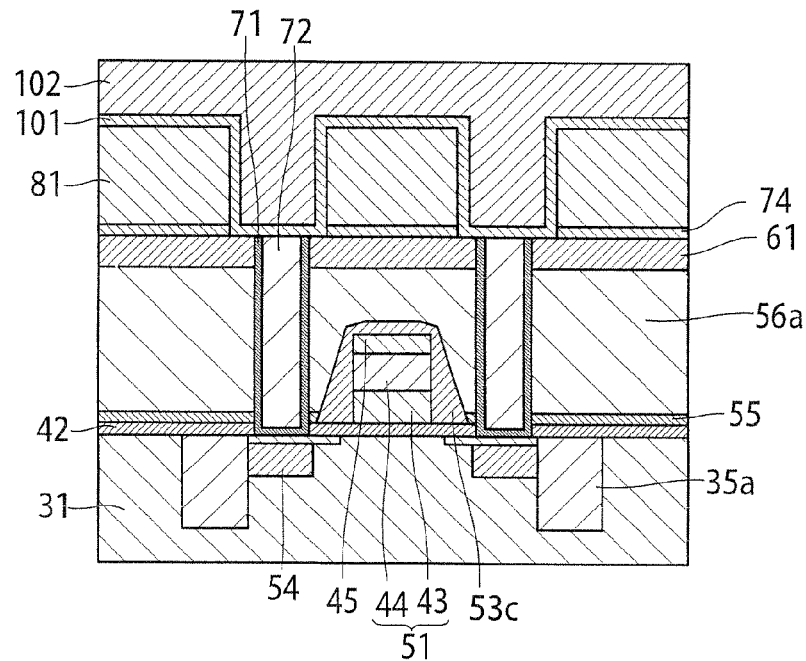
b)
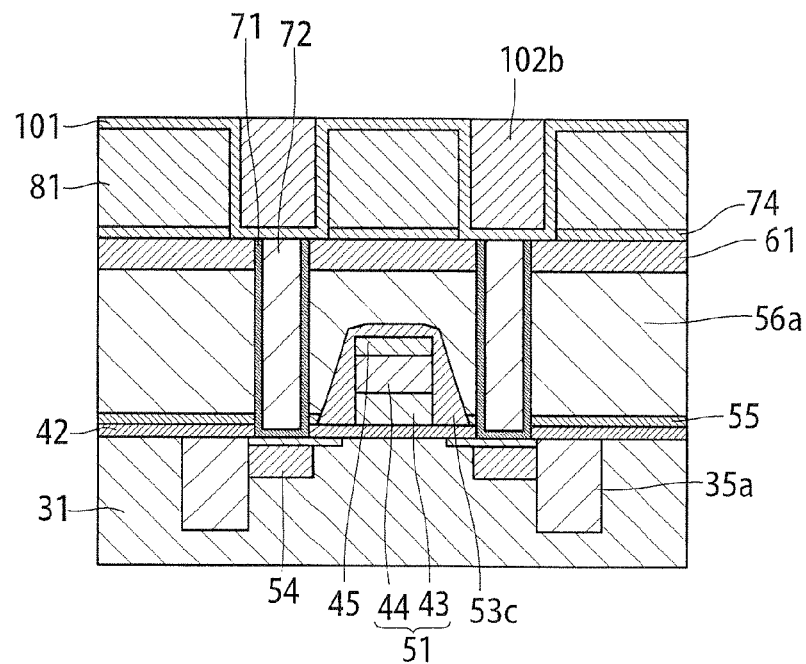

FIG. 11
a)
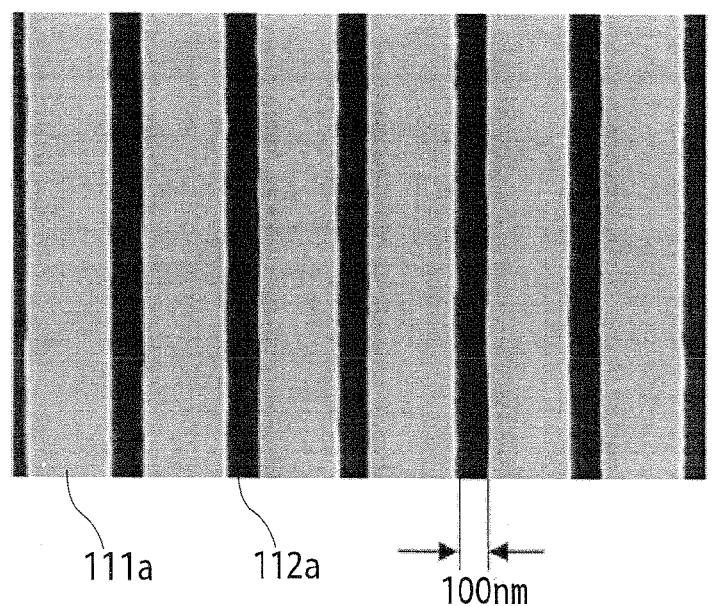
b)
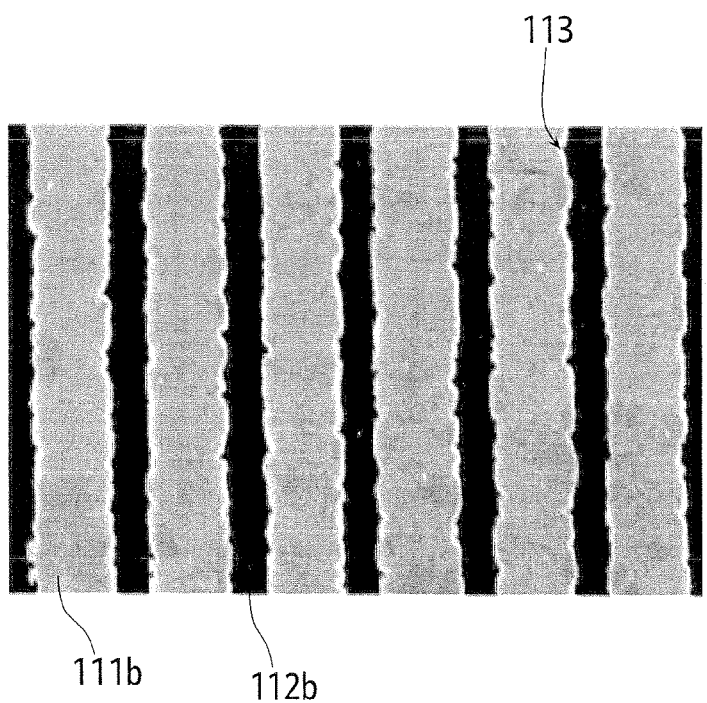

FIG.12
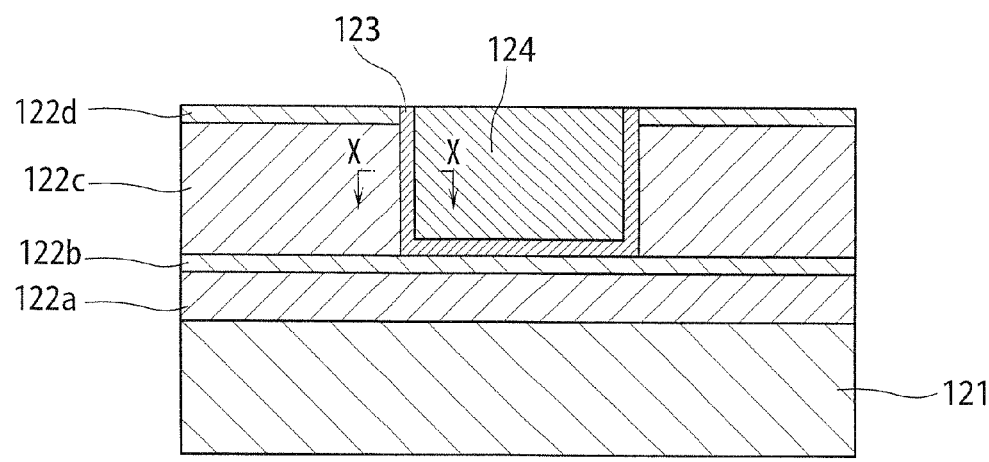
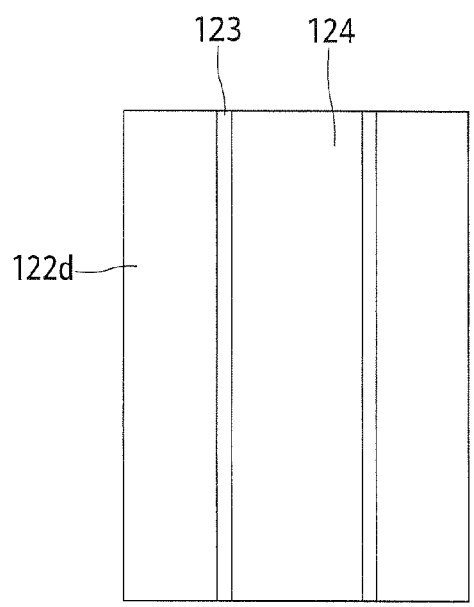
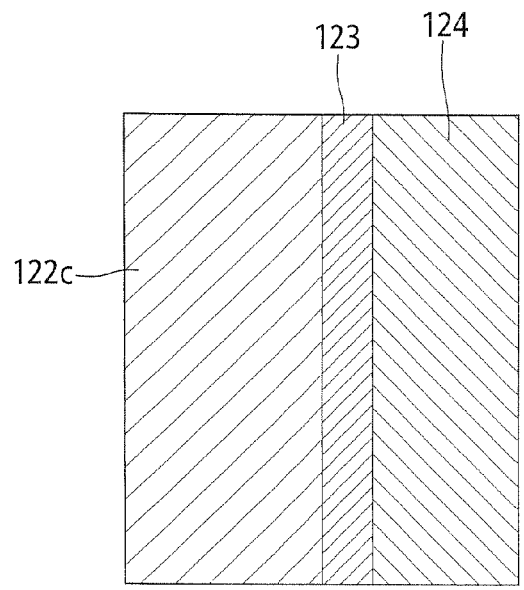

FIG.16
a)
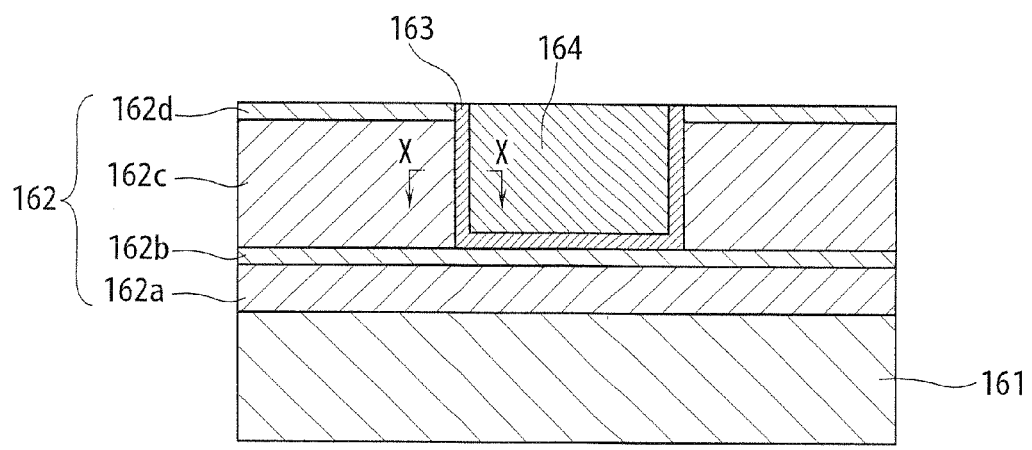
b)
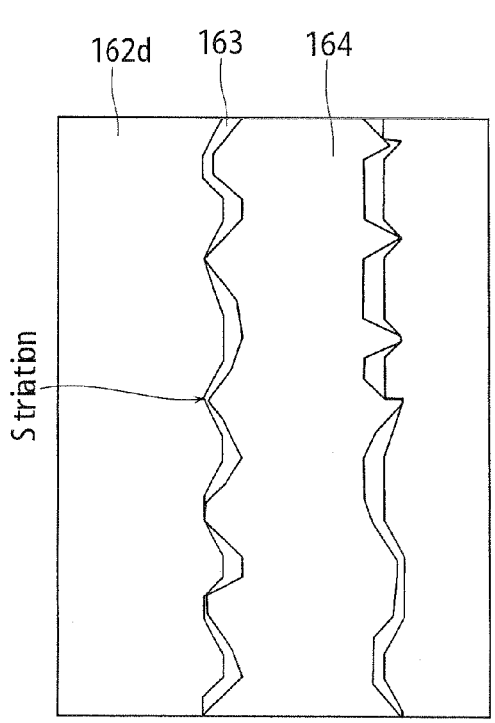
c)
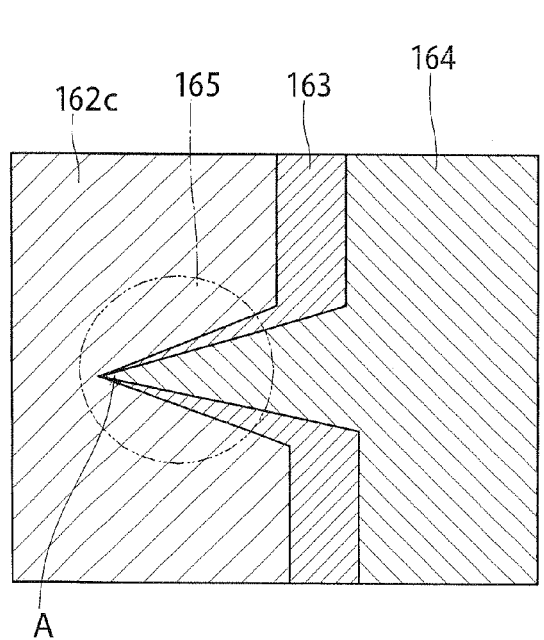

SEMICONDUCTOR DEVICE AND ETCHING APPARATUS

CROSS-REFERENCE TO RELATED APPLICATION

This non-provisional application is a continuation of and claims the benefit of U.S. application Ser. No. 11/664,091, filed Jul. 14, 2008, now abandoned, which claims priority to Application No. PCT/JP2006/307499 filed Apr. 7, 2006 in Japan. The disclosures of the prior applications are hereby incorporated herein in their entirety by reference.

BACKGROUND OF THE INVENTION

1. Field of the Invention

The present invention relates to a semiconductor device and a method for manufacturing the same and, in particular, to a semiconductor device and a method for manufacturing the same, wherein etching is carried out without any accompanying damage to a less-durable resist used during ArF-photolithography and, in turn, a problem is solved concerning Line Edge Roughness (LER; also referred to as "striation") permitting the formation of fine patterns of not more than 130 nm while ensuring a high degree of accuracy. The present invention likewise relates to a dry-etching process which permits etching without any accompanying damage of a less-durable resist used during ArF-photolithography as well as a method for making electrical connections by making use of the dry-etching process.

2. Description of the Related Art

Recently, the structural details of semiconductor devices have gradually become finer and finer and the layer structure thereof has included more and more layers as the integration density of LSI devices has increased and the operational speed thereof has become higher and higher. The light-exposure methods used in the production of these LSI devices frequently include methods using lasers, each emitting a beam having a short wavelength (for instance, an excimer laser). An example is ArF-photolithography. A mask pattern is transferred onto a resist material consisting of, for instance, a methacrylic resin or an acrylic resin to form a resist mask. Then, a film covered by the resist mask is finely processed by dry-etching to give holes or grooves for the formation of electrical connections. In such fine processing, a high processing accuracy is required in the formation of such an etching pattern while ensuring high accuracy in both the width and depth directions of the film. For this reason, etching has been carried out while ensuring a high anisotropy of the etching technique. Accordingly, a technique has been known in which dry-etching is carried out while introducing a desired etching gas into the plasma atmosphere (see, for instance, Patent Document 1 specified below).

Compounds free of any benzene ring have been known as a resist material used in ArF-photolithography. These compounds impart to the resist material permeability to light rays whose wavelengths fall within the range of vacuum ultraviolet light rays (see, for instance, Non-Patent Document 1 specified below).

When this resist material is exposed to the ArF laser light rays or beam, not only does the material become less-durable but also shows a reduced resistance (durability) to plasma as compared with the resist material possessing a benzene ring used as a resist material for KrF-photolithography. Thus, when etching is carried out in a plasma atmosphere, the resist mask prepared therefrom is exposed to an etchant present in the plasma. Consequently, the resulting resist mask suffers from various problems such that the edge portions of the patterned regions are roughened, and the periphery of the resulting pattern is deformed due to the influence of the ultraviolet light rays and the bombardment of the ions originated from the plasma discharge.

The attached FIGS. 15(a) to (c) and (a') to (c') are schematic cross-sectional and top-plan views of semiconductor devices provided for illustrating a method for the preparation of gates for the transistors present in a conventional semiconductor device. In a conventional gate-forming method, an oxide film 152 as shown in FIGS. 15(a) and (a') is grown on a substrate 151 of Si to a desired film thickness. A laminate film 153 consisting of a polysilicon film 153a and a tungsten film 153b is, for instance, formed thereon as a film for forming the gate electrodes. Then, an electrical insulating film 154 of $SiO_2$ for forming a hard mask is formed (or deposited) according to any known method, such as the CVD technique. Then, an anti-reflection film 155 is coated and formed, followed by the application or formation of a resist 156 (for instance, TARF-P6111 available from Tokyo Ohka Kogyo Co., Ltd.) for ArF-photolithography mainly comprising an acrylic resin. The resist film 156 thus formed is exposed to light rays using a known ArF-photolithography apparatus (such as TWINSCAN-XT1400 available from ASML Company) to form a resist mask 156 having a pattern corresponding to the desired gate electrodes on the laminate film 153 for forming such gate electrodes. In this connection, thin films generally used for such a hard mask include, for instance, electrical insulating films such as SiN films and SiC films prepared by CVD technique.

When the hard mask electrical insulating film 154, covered with the resist mask 156 carrying the pattern, is subjected to dry-etching in a plasma atmosphere to transfer the pattern onto the electrical insulating film 154 through the resist mask 156, the edges of the pattern are often distorted, the shape of the pattern is, in turn, deformed, and a part of the resist becomes thin and sometimes perforated (LER of the resist). If etching is continued using the resist mask carrying such defects, various problems arise. For instance, the hard mask is likewise distorted and/or deformed and the pattern, whose periphery has defects, is transferred. This leads to the occurrence of so-called striation as shown in FIGS. 15(b) and (b'). Thus, if dry-etching is further continued using the hard mask 154b, which causes such striation to thus transfer the damaged pattern onto the laminate film 153 for forming such gate electrodes through the hard mask 154b, the striation per se is transferred to the gate electrode-forming laminate film 153 as shown in FIGS. 15(c) and (c'). Such a striation may sometimes reach even a size on the order of 50 nm and, accordingly, this technique cannot satisfy requirements for highly precise processing through etching.

When this deformation called striation reaches even a size on the order of 50 nm, the resulting pattern may be acceptable as a line pattern if the pattern is so designed that it has a line width of 200 nm. However, if the line width is designed to be not more than 130 nm and there are defects having a width from the periphery of 50 nm, the resulting pattern having such a narrow remaining line width is not acceptable as compared with the designed line width. Accordingly, this patterning technique cannot be used for the manufacture of a semiconductor device provided thereof with a fine pattern.

As has been discussed above in detail, the material generally used for forming gates of transistors is polysilicon or a material having a laminate structure consisting of a polysilicon layer and a tungsten layer applied onto polysilicon layer. In this case, the gate length Lg is an important parameter for manufacturing transistor gates to determine the threshold voltage for distinguishing the on and off operations of a transistor. Therefore, the gate length should accurately be controlled. When striation or any deformation of the pattern edge is caused while etching the material for forming gates, a single gate would have a distribution of gate lengths Lg. This results in the formation of transistors having mixed long and short gate lengths Lg, in a parallel connection. Accordingly, the threshold voltage of the resulting transistor is broad and the transistor never shows sharp on-off characteristic properties.

When the threshold voltage of a transistor becomes broad, additional voltage is needed for operating the transistor. This accordingly leads to an increase in the design voltage of a power source. This would be attended by such a bad effect that the resulting device consumes a large quantity of electric power. Moreover, if there is a divergence in the median of the threshold voltage, it is necessary to design the transistor such that it has a long logic cycle to adjust the timing of the operations thereof. The resulting transistor cannot permit any high speed operation. Such a high voltage of the power source and such a slow logic cycle cannot satisfy the recent conditions required for the designation of goods, such as a high integration density, a high speed operability and a low power-consumption. Accordingly, it is quite important to carry out such processing while limiting the distribution of gate lengths Lg within a single gate to a level as low as possible.

Under such circumstances, control of the line width would be quite important in the gate-forming step. When a pattern is transferred onto a resist layer by ArF-photolithography and then a gate material is directly etched through the resist pattern as a mask, the resist as a mask should be so designed to have a thickness considerably greater than that of the material to be etched. When the resist is so designed, the depth of focus (DOF) is smaller than the thickness of the resist. Accordingly, problems arise such that there are portions, which are out of focus, in the deeper region within the resist and, therefore, an accurate pattern cannot be transferred. As a method for eliminating this problem, conventionally a resist pattern is transferred onto a hard mask having high resistance to any etching operation through a thin resist serving as a mask. When the thickness of the resist is reduced, however, additional problems arise such that a striation is caused when etching such a hard mask and that each single gate has a distribution of gate lengths Lg.

When producing copper electrical connections (also hereafter referred to as Cu-connections) according to conventional ArF-photolithography and etching, for instance, the single damascene method, an $SiO_2$ film 162a is deposited on the transistor-forming region 161 by the CVD technique. An SiN film 162b is then deposited thereon as an etching-stopper layer. An $SiO_2$ film 162c is further deposited, and a second SiN film 162d is deposited thereon as a CMP-stopper layer to thus form an interlayer insulating (dielectric) film 162 as shown in FIG. 16(a). Then, an ArF-resist mask (not shown) carrying an electrical connection pattern is formed on the interlayer dielectric film 162 according to known ArF-photolithography, such as for the above-described gate-forming method. Then, the interlayer dielectric film 162 covered with this resist mask for the ArF-photolithography is subjected to dry-etching within a plasma atmosphere for the transfer of the electrical connection pattern into the interlayer dielectric film 162 to form grooves and holes to be filled with a metal electrical connection material. A barrier metal layer such as a TaN film 163 is formed on and/or within the grooves and holes thus formed according to any known sputtering technique and then a Cu film is formed by the Cu-plating technique to fill the grooves and holes with the metal electrical connection material. Finally, a Cu-electrical connection 164 is completed likewise by any known CMP method.

When forming the Cu-connection 164 in this way, while applying the conventional pattern-transfer technique, striations are generated, for instance, on and/or within the grooves and holes as shown in FIG. 16(b). For this reason, deep constricted parts 165 are formed at the edges of the pattern of holes and/or grooves present on the $SiO_2$ film 162c constituting the interlayer dielectric film as shown in FIG. 16(c) and a sufficient amount of the barrier metal 163 cannot penetrate into the grooves and/or holes. Various problems arise such as insufficient barrier characteristic properties. The Cu 164 serving as an electrical connection material may penetrate and diffuse into the thin film to cause short circuits between electrical connections in proximity to one another. If the extent of this short circuit-formation is quite light, this becomes a cause of current leakage. The variation of the short circuit-formation with the elapse of time may become a cause of marketing defects of the resulting articles. In this respect, the term "marketing defects of articles" herein used means that an article having a semiconductor device is considered damaged during its circulation in the marketplace.

If narrow portions are only partially present in the electrical connections, the connections are quite liable to breakage. For this reason, the width of the electrical connection is increased at the time of its design to prevent any reduction of the width of such a narrower portion to a level of less than the predetermined level. However, the tip area of the resulting semiconductor device correspondingly increases. This may reduce the number of designed tips per wafer and, in turn, increase the production cost thereof. Accordingly, it would be necessary to manufacture articles which have low scattering in the finished line widths.

When subjecting an interlayer dielectric film (electrical insulating film) to dry-etching through a resist mask, the resist mask first undergoes deformation. The interlayer dielectric film is etched through the deformed resist mask and thereby transfers the deformation of the resist mask onto the dielectric film as the deformation of the film pattern (this deformation is so-called striation). The electrical connections of a semiconductor device are formed by filling the grooves in which the striation is generated with a barrier metal layer and a Cu film. Accordingly, the striations within the grooves are transferred as the striations of the electrical connections. The number of layers constituting the electrical connections of a semiconductor device is often ten or more in the case of, for instance, the usual system LSIs and memory devices. Accordingly, the reduction of such striations, which may result in the yield reduction, would be quite important to reduce the production cost.

In the case of the transfer of a pattern having line width and space between the neighboring lines of not less than 200 nm, the generation of striation can be controlled by the use of a material having a benzene ring as a mask for the layer of a resist for KrF-photolithography. The resist used in KrF-photolithography is highly resistant to irradiation with ultraviolet light rays emitted by the action of the plasma generated within a chamber for dry-etching and likewise to the fluorine radicals generated through the decomposition of $C_3F_8$ used as an etching gas. For this reason, when striation, which is irregular deformation of a resist, is relatively small, the design line width thereof is rather large as compared with the striation generated and therefore, a problem does not arise. In the case of the semiconductor devices of new generation, the line width and space between each pair of neighboring lines of not more than 130 nm and, in particular, not more than 100 nm are required. However, photolithography technique has been employed which makes use of an ArF laser. The resist used in this case would have a chemical structure quite sensitive to irradiation with ultraviolet light rays and fluorine radicals. Accordingly, the resulting striation is greater than that observed for the resist having a compound including a benzene ring used in the KrF-photolithography method. Therefore, a problem arises such that the rate of such striation relative to the line width becomes high and this, in turn, reduces the yield of the semiconductor device-manufacture.

To solve the foregoing problem concerning the generation of striations, a conventional technique has been proposed which comprises the steps of introducing a fluorocarbon gas-containing mixed gas into a low-pressure plasma atmosphere, forming a resist as a mask by ArF-photolithography and then subjecting a film (an interlayer dielectric film) to dry-etching through the resist as the mask (see, for instance, Patent Document 2 specified later). This technique would permit the control of the generation of striation by practicing the dry-etching at a low pressure. However, the technique is not a practical one from the economical standpoint since the etching rate is significantly reduced.

Patent Document 1: Japanese Un-Examined Patent Publication Hei 11-31678 (for instance, Claims);

Patent Document 2: Japanese Patent Application Serial No. 2004-56962 (Japanese Un-Examined Patent Publication 2005-251814) (for instance, Claims); and Non-Patent Document 1: Koji NOZAKI and Ei YANO, FUJITSU Sei. Tech. J., 2002 (June), 38(1): 3-12.

SUMMARY OF THE INVENTION

As has been discussed above, in the conventional method for the production of semiconductor devices, ArF-photolithography should be employed as a means for producing a semiconductor device containing a fine pattern having a width on the order of not more than 130 nm, and in particular, not more than 100 nm. Accordingly, a problem arises such that the manufacture yield of semiconductor devices is reduced since the rate of striations with respect to the pattern size of, for instance, the gate length, the electrical connection width or the diameter of contact holes increases.

It is accordingly an aspect of the present invention to provide a semiconductor device and a method for the manufacture thereof so designed that etching can be performed without causing any damage of a less-durable resist mask for ArF-photolithography even if the resist carries fine patterns having a size of not more than 130 nm and is formed using ArF-photolithography. This can likewise permit the solution of the foregoing problems associated with the conventional method and can thus control the generation of striation and improve the production yield of the semiconductor device.

It is another aspect of the present invention to provide a dry-etching process which permits etching without damaging a less-durable resist and a method for making electrical connections using this dry-etching process.

To accomplish the foregoing aspects, the semiconductor device according to the present invention is provided with the thin film carrying patterns which are transferred onto the semiconductor device by subjecting to dry-etching within plasma atmosphere the thin film covered with a resist mask carrying an original for the patterns formed by ArF-photolithography. The semiconductor device is characterized in that the thin film has patterns transferred from the foregoing resist mask by etching the thin film using a resist mask in which at least one of the width of each pattern and the space between neighboring two patterns ranges from 32 to 130 nm and likewise using, as an etching gas, a halogenated carbon-containing compound gas (provided that the halogen is at least two members selected from the group consisting of F, I and Br; and that the ratio of at least one of I and Br is not more than 26% of the total amount of the halogen atoms as expressed in terms of the atomic compositional ratio).

The semiconductor device according to the present invention is provided with a portion to which patterns are transferred by subjecting to dry-etching within a plasma atmosphere a thin film covered with a resist mask carrying an original for the patterns formed by ArF-photolithography to form a hard mask and then etching through the hard mask to transfer the patterns present on the hard mask onto a semiconductor device. The semiconductor device is characterized in that the desired patterns to be transferred to the foregoing portion are first transferred to the foregoing hard mask from the foregoing resist mask according to the etching carried out using a resist mask carrying patterns in which at least one of the width of each pattern and the space between neighboring two patterns ranges from 32 to 130 nm and likewise using, as an etching gas, a halogenated carbon-containing compound gas (provided that the halogen is at least two members selected from the group consisting of F, I and Br; and that the ratio of at least one of I and Br is not more than 26% of the total amount of the halogen atoms as expressed in terms of the atomic compositional ratio) and that the pattern is then transferred from the hard mask to the semiconductor device.

In addition, the method for manufacturing a semiconductor device according to the present invention comprises the step of transferring patterns onto a thin film covered with a resist mask carrying an original for the patterns formed by ArF-photolithography. A thin film covered with a resist mask carrying an original for the patterns in which at least one of the width of each pattern and the space between neighboring two patterns ranges from 32 to 130 nm is subjected to etching using as an etching gas a halogenated carbon-containing compound gas (provided that the halogen is at least two members selected from the group consisting of F, I and Br; and that the ratio of at least one of I and Br is not more than 26% of the total amount of the halogen atoms as expressed in terms of the atomic compositional ratio).

A mask used in the present invention is a resist mask carrying patterns in which the width of each pattern and/or the space between neighboring two patterns ranges from 32 to 130 nm and the etching gas used herein is a halogenated carbon-containing compound gas comprising at least one member selected from the group consisting of I and Br which are quite stable compounds and, in themselves, function as etchants for substances such as Si. Accordingly, the present invention permits the control of the generation of striations having a high rate with respect to the pattern size when forming fine patterns having a pattern size on the order of not more than 130 nm through etching and the reduction of the fluorine atom density within the plasma atmosphere without relying on the reduction of the pressure during etching to thus greatly reduce the occurrence of any damage of the resist mask. For this reason, a desired pattern can be transferred by subjecting a thin film to plasma etching without any accompanying damage to a resist mask (such as deformation and/or defects). Therefore, even fine patterns, each having a size of not more than 130 nm, such as those of holes and/or grooves, can be formed while overcoming such a drawback as the generation of striations. Accordingly, the present invention permits the precise processing of a thin film.

In addition, a pattern is transferred from a resist mask onto a thin film to thus form a hard mask. Then an underlying material behind the thin film can be accurately etched through the hard mask. Accordingly, a resist pattern can thus accurately be transferred onto an underlying material through the hard mask carrying the pattern.

The foregoing thin film usable herein may be, for instance, an electrical insulating film. When this electrical insulating film serves as an interlayer dielectric film, the transferred patterns can further be filled with a metal electrical connection material according to the damascene technique.

Moreover, this electrical insulating film can be composed of a material containing either C or N and the relative dielectric constant thereof is desirably not less than 1.5 and not more than 3.7.

Incidentally, the foregoing thin film on which a desired pattern is transferred can be used as a mask for the etching treatment of an underlying material behind the thin film. Therefore, the underlying material can be used as a film for forming gate electrodes on an Si substrate.

Examples of the foregoing films usable herein for forming gate electrodes include conductive films containing W, Ti, Ta, Co or Ni or a polysilicon film or a laminate film comprising the conductive film and a polysilicon film.

Moreover, the present invention is quite suitably used for a memory device selected from DRAM and flash memories, a logic device, a system LSI, or a semiconductor device which comprises these elements and/or devices in or as a part thereof. The invention is likewise quite suitably used as a method for manufacturing these elements and/or devices.

The dry-etching process according to the present invention comprises the steps of subjecting to dry-etching within a plasma atmosphere a thin film covered with a resist mask carrying patterns formed by ArF-photolithography in which at least one of the width of each pattern and the space between neighboring two patterns ranges from 32 to 130 nm, while using, as an etching gas, a halogenated carbon-containing compound gas (provided that the halogen is at least two members selected from the group consisting of F, I and Br; and that the ratio of at least one of I and Br is not more than 26% of the total amount of the halogen atoms as expressed in terms of the atomic compositional ratio) to thus transfer the foregoing patterns onto the foregoing thin film.

Furthermore, in this dry-etching process, the patterns transferred from the resist mask onto the thin film can be used as a hard mask for accurately etching an underlying material present behind the thin film. Accordingly, the resist pattern can thus accurately be transferred onto the underlying material through the hard mask carrying the pattern. The foregoing thin film usable herein may be, for instance, an electrical insulating film. When this electrical insulating film serves as an interlayer dielectric film, the transferred patterns can further be filled with a metal electrical connection material according to the damascene technique. Moreover, this electrical insulating film can be composed of a material containing either C or H and the relative dielectric constant thereof is desirably not less than 1.5 and not more than 3.7.

The thin film on which desired patterns are transferred can be used as a mask for etching of an underlying material present behind the thin film. Therefore, the underlying material can be used as a film for forming gate electrodes or an Si substrate. Examples of the foregoing films usable herein for forming gate electrodes include conductive films each containing W, Ti, Ta, Co or Ni or a polysilicon film or a laminate film comprising the conductive film and a polysilicon film.

According to the present invention, when manufacturing a semiconductor device by forming, through etching, fine patterns having a pattern size on the order of not more than 130 nm, a thin film can be subjected to plasma etching without any accompanying damage to a resist mask (such as deformation and/or formation of defects). Therefore, a thin film can accurately be processed to form even fine patterns each having a size of not more than 130 nm. Accordingly, holes and/or grooves can be formed on or through a dielectric film while overcoming such a drawback as the generation of striations. Therefore, the patterns of the dielectric film can be used as a mask to accurately etch an underlying material of the thin film and to thereby accurately transfer the resist patterns onto the underlying material. For this reason, holes, grooves, or the like, free of striation can be formed. This permits the manufacture of a semiconductor device provided with, for instance, electrical connections and transistor gates having accurate dimensions. Thus, even when forming patterns having a size of not more than 130 nm, the size of defects generated in and around the patterns such as deformation can be limited to a level on the order of not more than 50 nm. Accordingly, the present invention permits the production of semiconductor devices which can correctly show their design functions, in a good yield.

In addition, the effects of the etching gas used in the present invention are independent of the dimensions of patterns to be formed and are accordingly effective even in manufacturing semiconductor devices of the 90 nm size-generation, the 65 nm size-generation and the 45 nm size-generation.

BRIEF DESCRIPTION OF THE DRAWINGS

FIG. 8 is a cross-sectional view of a semiconductor device illustrating the process subsequent to that as shown in FIG. 7;

FIG. 9 is a cross-sectional view of a semiconductor device illustrating the process subsequent to that as shown in FIG. 8;

FIG. 10 is a cross-sectional view of a semiconductor device illustrating the process for making electrical connections subsequent to that as shown in FIG. 9;

FIG. 11 shows an SEM image (a) obtained by the observation of the conditions of the grooves produced in Example 1 viewed from the top surface of the substrate and an SEM image (b) observed for the conventional example carried out for the purpose of comparison;

FIG. 12 shows the cross-sectional structure (a) of a sample obtained after the completion of the steps (1) to (11) of Example 2, the schematic top plan view (b) thereof and the cross-sectional view (c) of the electrical connection cut along the line X-X in FIG. 12(a);

FIG. 16 shows the cross-sectional view (a) and the top-plan view (b) of the Cu-electrical connections prepared according to the conventional technique and the expanded top-plan view (c) observed when the electrical connection is cut along the line X-X shown in FIG. 16(a).

DETAILED DESCRIPTION OF THE PREFERRED EMBODIMENTS

The following are detailed descriptions of the best modes for carrying out the present invention, i.e., the semiconductor device and the method for manufacturing the same, as well as the process for dry-etching a thin film and the method for making electrical connections using the dry-etching process, while referring to the accompanying drawings.

Figure 1:
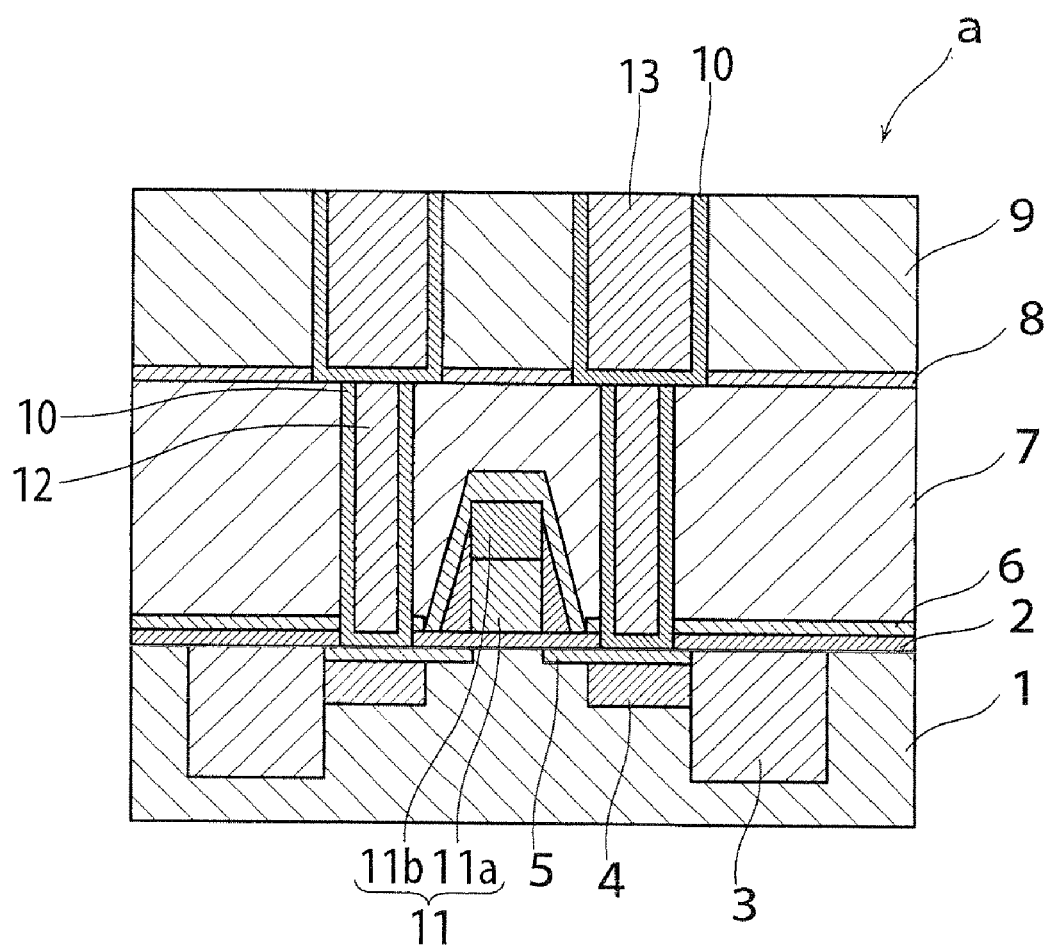
FIG. 1 is a schematic cross-sectional view showing a semiconductor device obtained by forming gates of transistors while applying the dry-etching process of the present invention.

FIG. 1 is a schematic cross-sectional view showing an embodiment of the semiconductor device according to the present invention. In the semiconductor device a according to this embodiment, a part of the surface of a silicon crystal 1 is covered with a gate oxide film 2. In the silicon crystal 1, an element-separating structure 3 (STI: Shallow Trench Isolation), deep sources and drains 4, and shallow sources and drains 5 are disposed. In addition, a gate electrode 11 of a laminate film comprising a polysilicon film 11a and a tungsten (W) film 11b is arranged on the gate oxide film 2. Tungsten electrical connections 12 electrically connected to these sources and drains are connected to upper electrical connections each consisting of a barrier metal film 10 (a TiN film) and a copper (Cu) film 13. A BPSG film 7 which electrically and mutually isolates these tungsten electrical connections 12 is sandwiched between a lower $SiO_2$ film 6 and an upper SiN film 8. Similarly, the device is so designed that a TEOS-$SiO_2$ film 9 for mutually isolating the upper electrical connections, each comprising a barrier metal film 10 and a copper layer 13, is formed on the upper SiN film 8.

In the present invention, the gas used for etching the dielectric film is a fluorinated carbon-containing compound gas containing at least one member selected from the group consisting of I and Br which can form quite stable compounds and, in themselves, function as etchants for Si. Examples of such fluorinated carbon-containing compound gases include iodinated and fluorinated carbon-containing compound gases or brominated and fluorinated carbon-containing compound gases and mixtures thereof which may be used alone or in combination.

The semiconductor device a according to this embodiment is provided with a thin film carrying patterns transferred from a resist mask through dry-etching operation without being damaged by such an etching gas. Accordingly, the device is free of striation in the structure thereof carrying the transferred patterns of, for instance, STI 3, the gate electrodes 11, the W electrical connections 12, and the Cu electrical connections 13. Consequently, the resulting semiconductor device can be provided with transistors, each having a small distribution of gate lengths Lg and sharp on-off characteristics, and electrical connections whose leakage between the connections is significantly reduced. Moreover, the device has a low rate of defects resulting from any change with time such as the diffusion of Cu due to such a striation.

Figure 2:
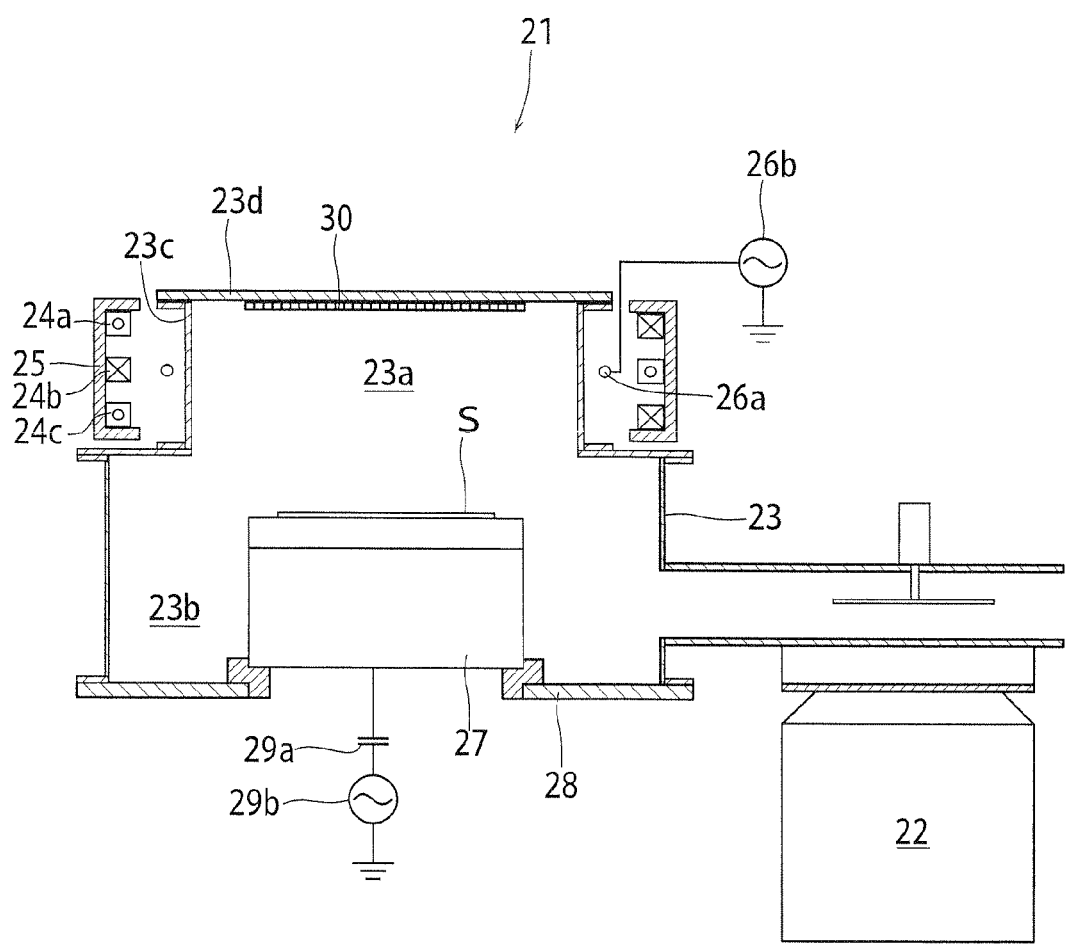
FIG. 2 is a cross-sectional view schematically showing the arrangement of an embodiment of an etching apparatus used in the dry-etching process of the present invention.
Figure 3:
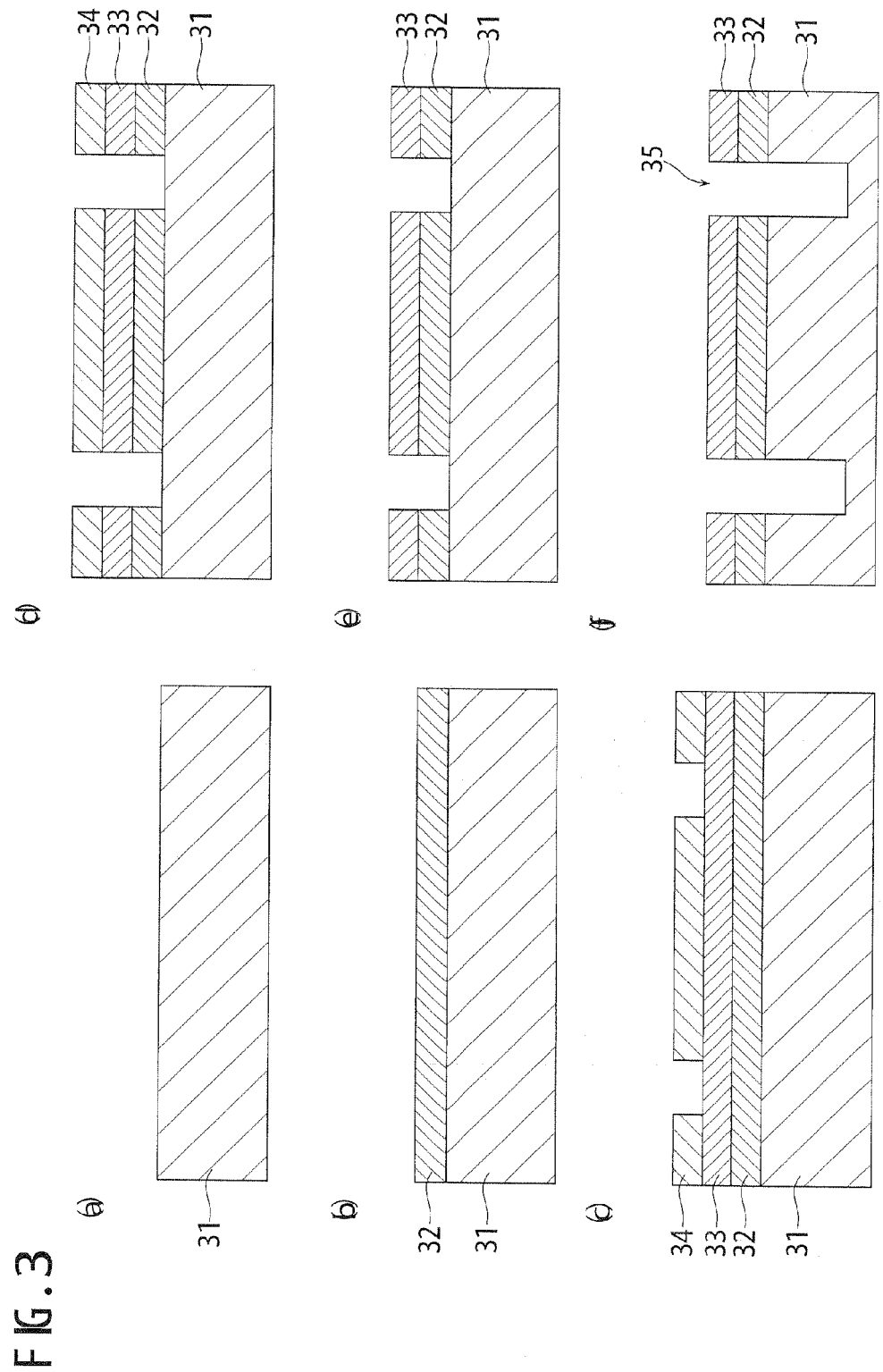
FIG. 3 is a cross-sectional view of a semiconductor device which shows or illustrates the first process of an embodiment of the method for manufacturing a semiconductor device according to the present invention.
Figure 4:
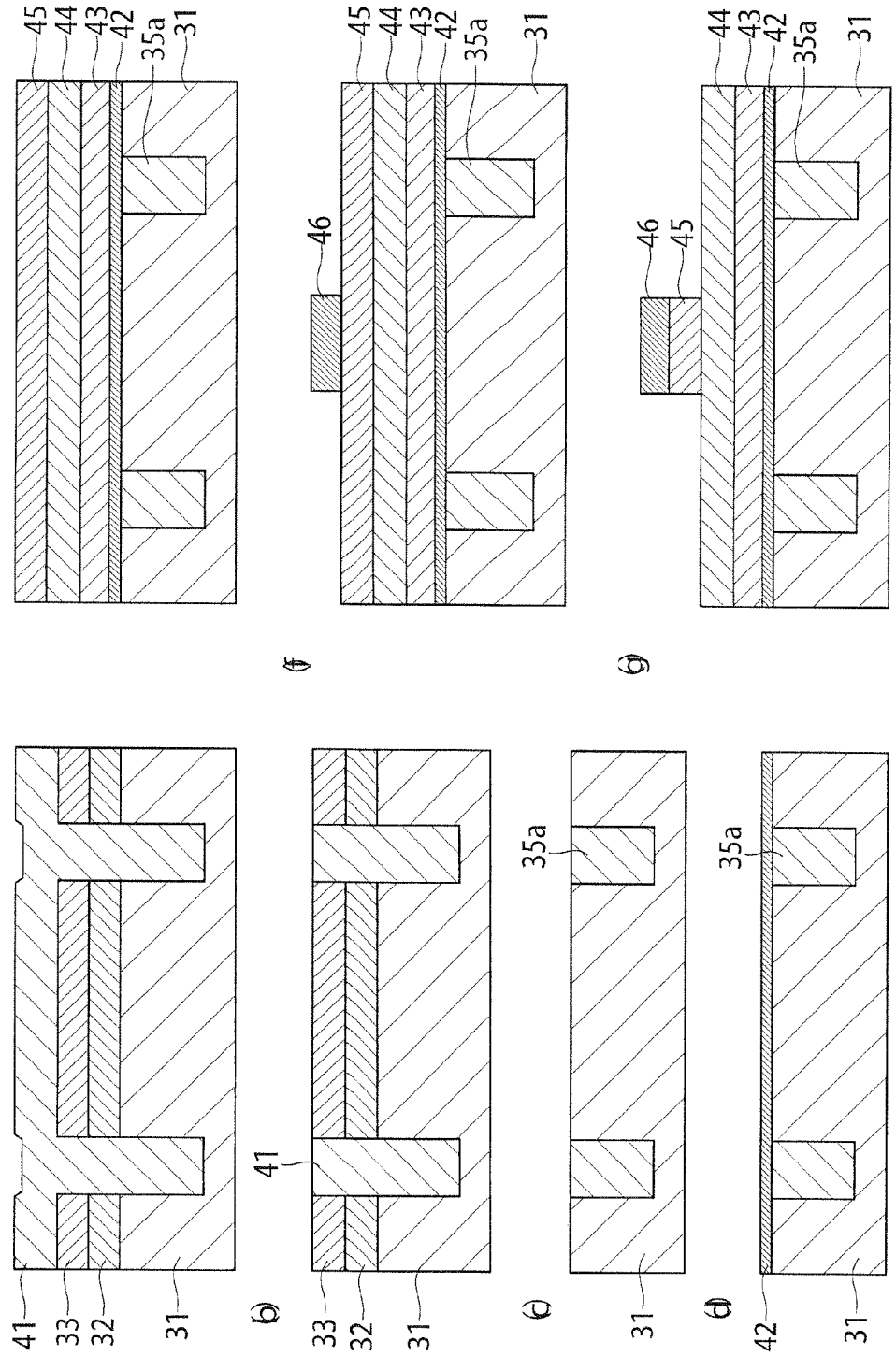
FIG. 4 is a cross-sectional view of a semiconductor device illustrating the process subsequent to that as shown in FIG. 3.
Figure 5:
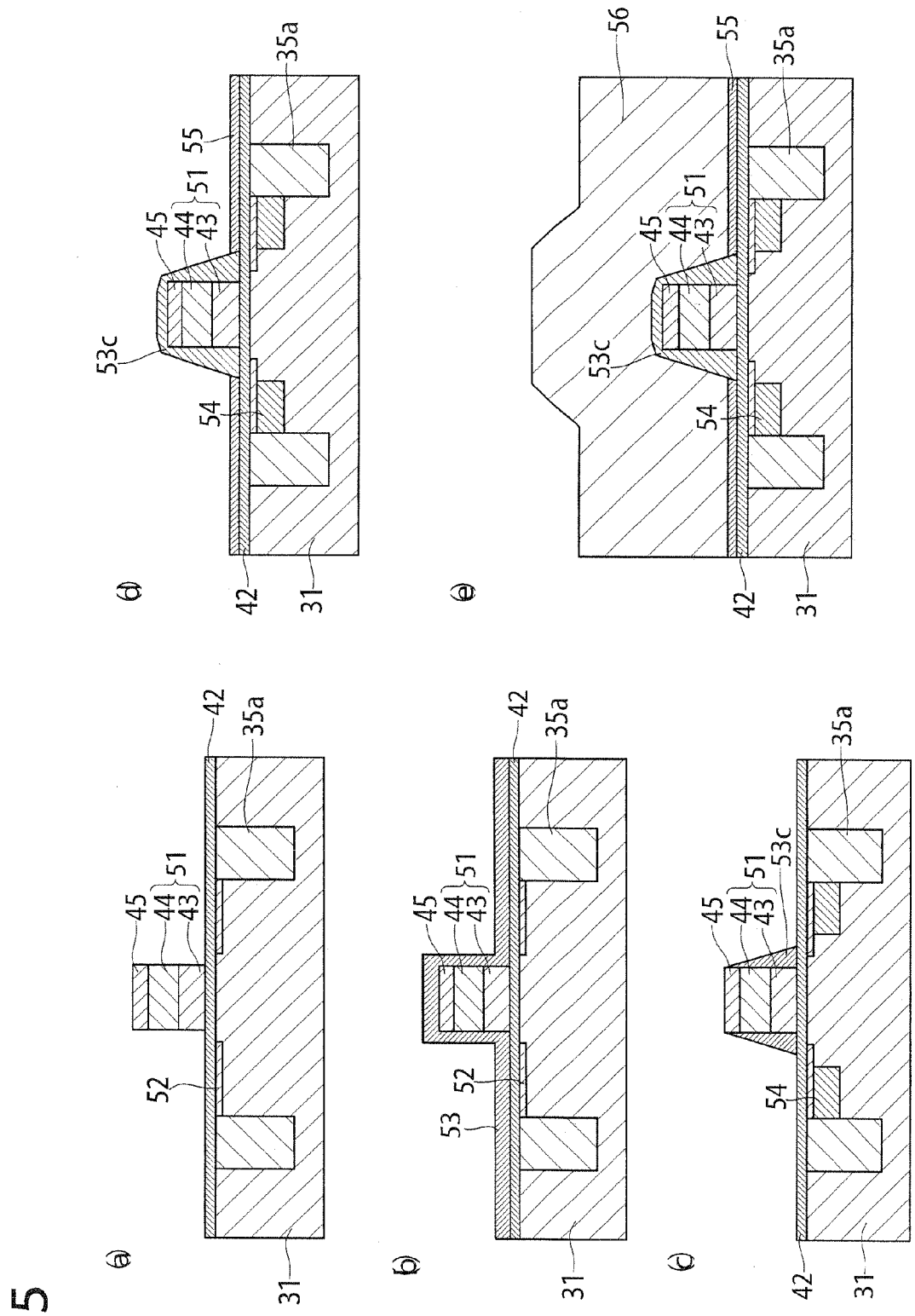
FIG. 5 is a cross-sectional view of a semiconductor device illustrating the process subsequent to that as shown in FIG. 4.
Figure 6:
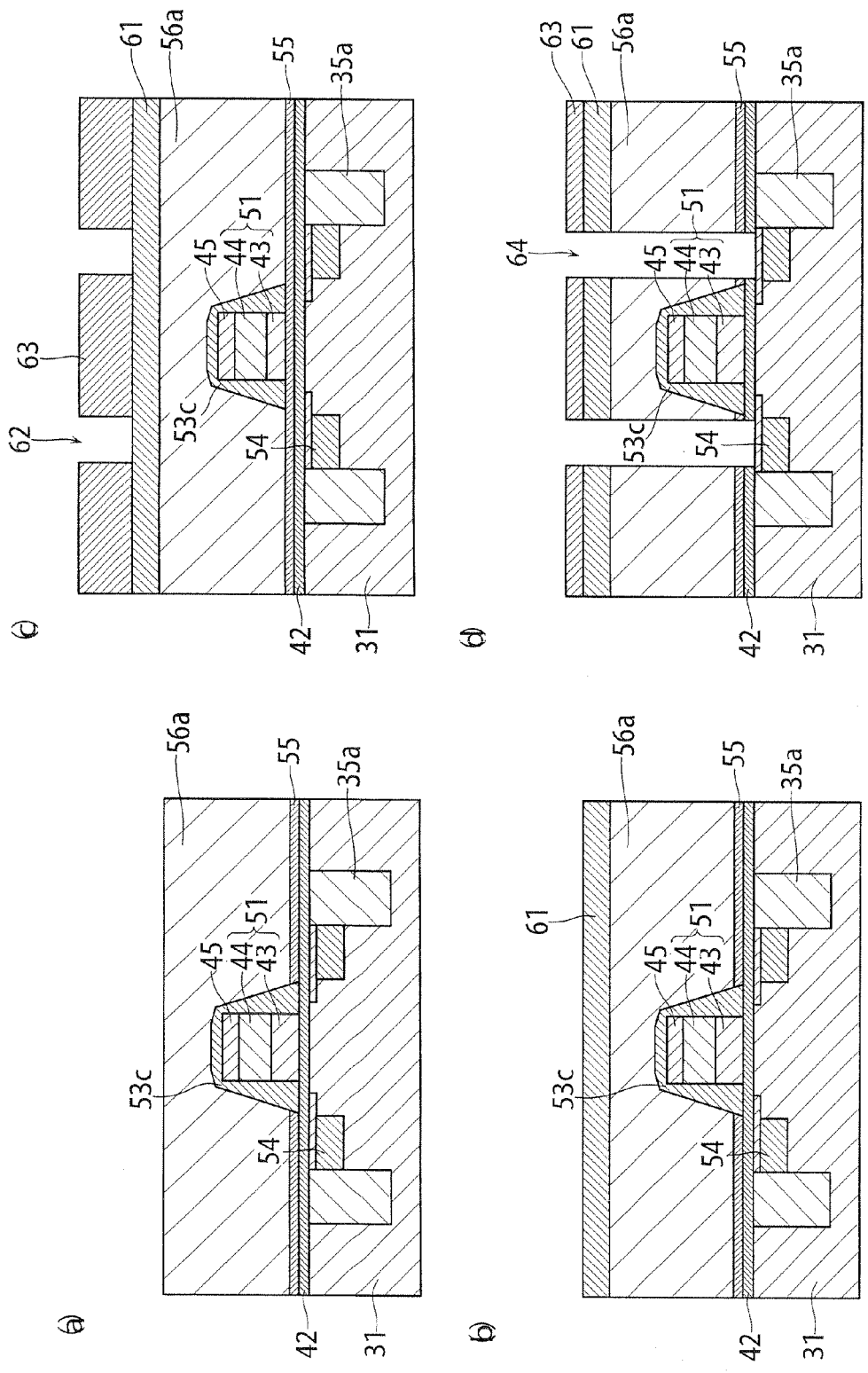
FIG. 6 is a cross-sectional view of a semiconductor device illustrating the process subsequent to that as shown in FIG. 5.
Figure 7:
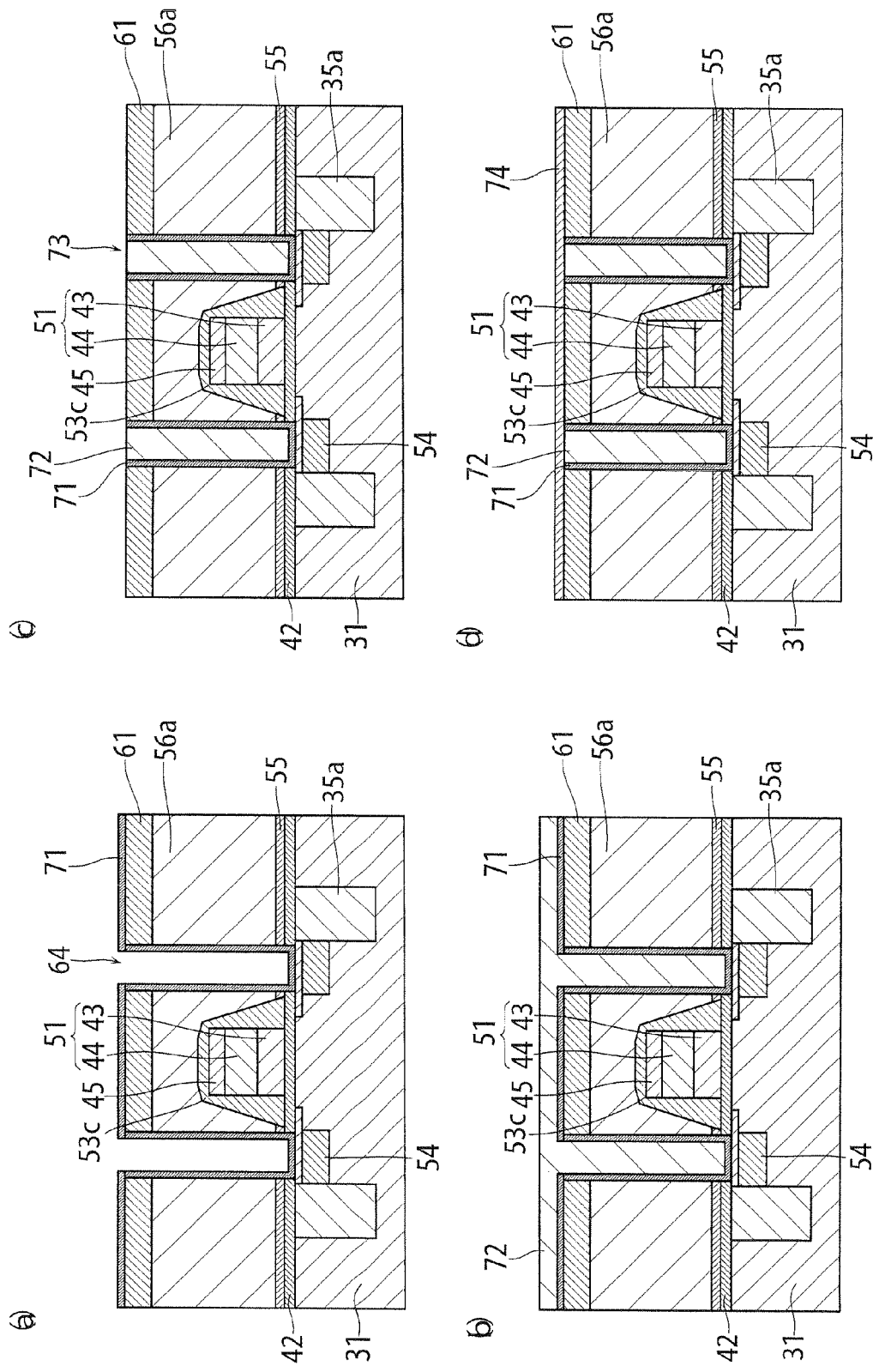
FIG. 7 is a cross-sectional view of a semiconductor device illustrating the process subsequent to that as shown in FIG. 6.
Figure 13:
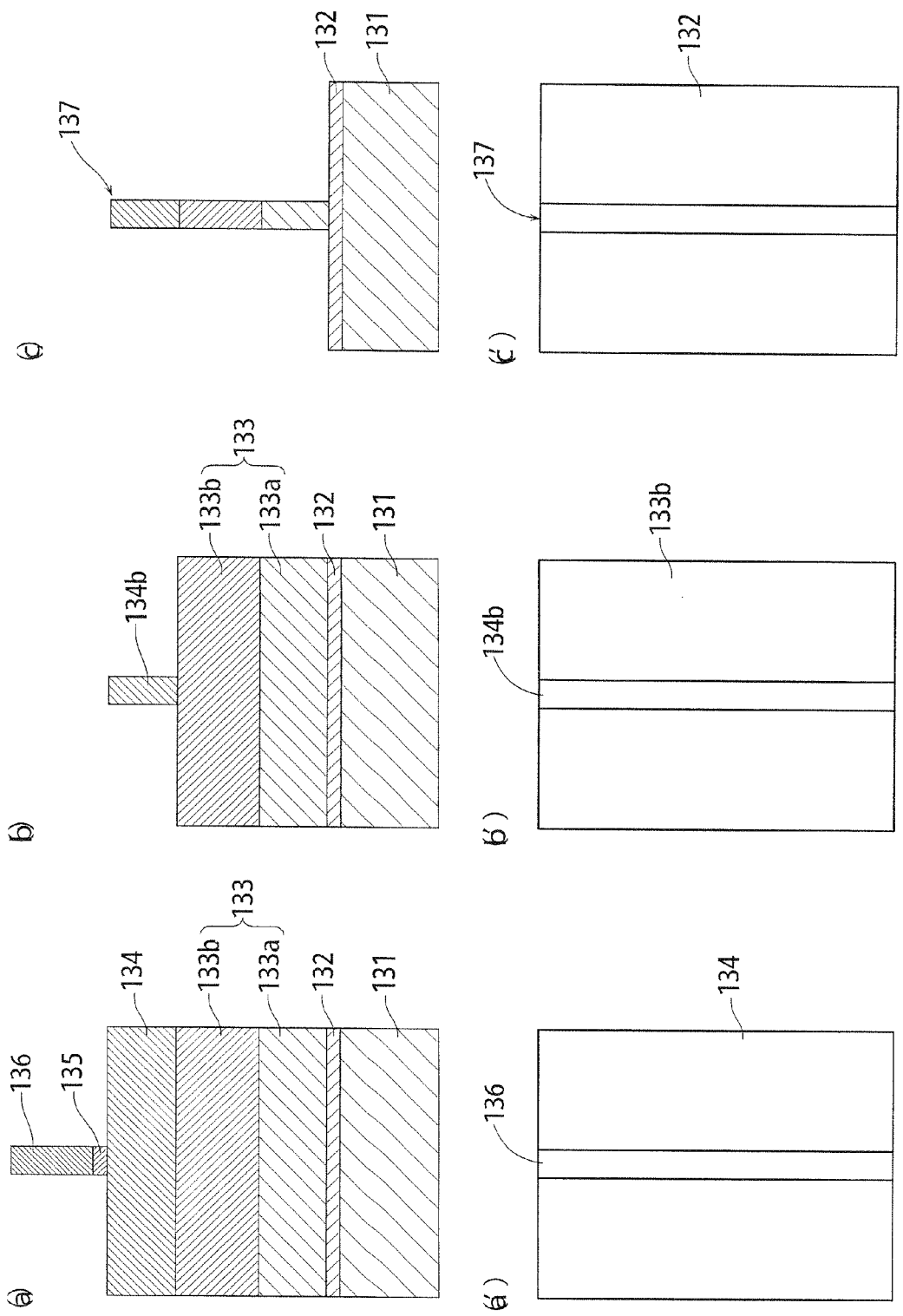
FIG. 13 schematically shows the cross-sectional views (a) to (c) and the top plan views (a') to (c') of the semiconductor device a in order to describe the principal steps for producing gates included in the semiconductor device according to the present invention, respectively.
Figure 14:
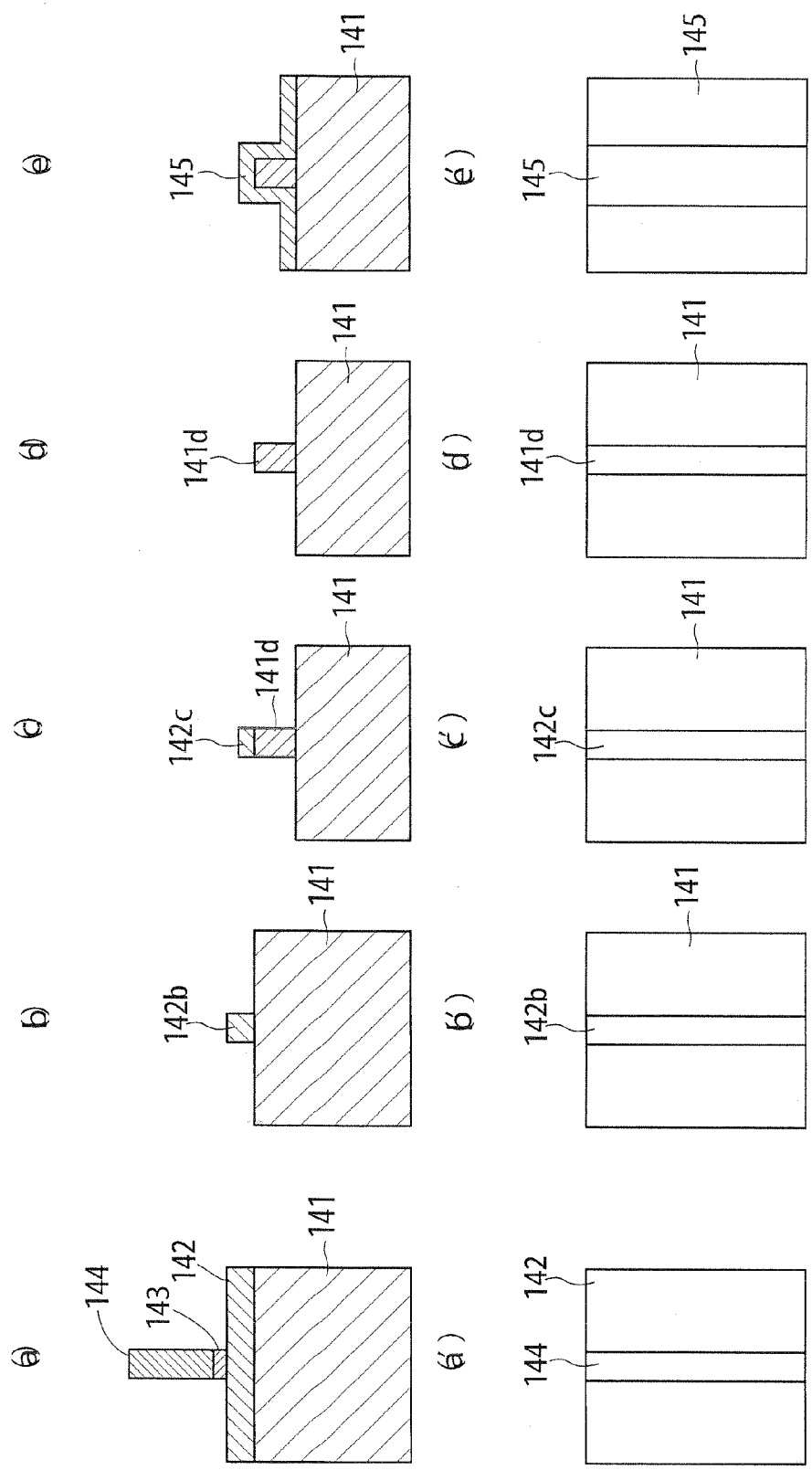
FIG. 14 shows the cross-sectional views (a) to (e) and the top plan views (a') to (e'), respectively, schematically illustrating the method for the preparation of channels for FIN-type transistors to which the present invention is applied.

The etching apparatus used in the present invention will now be described in detail below while referring to FIG. 2. This etching apparatus 21 uses an electric discharge plasma (NLD plasma) generated within a region including zero magnetic field areas. The apparatus 21 is equipped with a vacuum chamber 23 provided with an evacuation means 22 such as a dry pump, a rotary pump and/or a turbo molecular pump.

The chamber 23 comprises an upper plasma-generation compartment 23a having a cylindrical side wall 23c made of a dielectric material such as quartz and a lower substrate-processing compartment 23b. Three magnetic field-establishing coils 24a, 24b and 24c are arranged on the exterior of the cylindrical side wall 23c at predetermined intervals to constitute a magnetic field-generation means. These three magnetic field-establishing coils 24a, 24b and 24c are fitted to a yoke member 25 made of a material having a high magnetic permeability in such a manner that the yoke member externally surrounds these coils including the upper and lower sides thereof. Electric currents are concurrently applied to the respective upper and lower magnetic field-establishing coils 24a and 24c, while an electric current is counter-currently passed through the intermediate magnetic field-establishing coil 24b. Thus, a continuous zero magnetic field zone is formed on the inside of the cylindrical side wall 23c and in proximity to the intermediate magnetic field-establishing coil 24b to form an annular magnetic neutral line or loop.

The size of the annular magnetic neutral loop can properly be set at a desired level by variously changing the ratio of the electric current applied to the upper and lower magnetic field-establishing coils 24a and 24c to the electric current applied to the intermediate magnetic field-establishing coil 24b. The upper and lower positions of the annular magnetic neutral loop can likewise be set at a desired level by properly selecting the ratio of the electric current applied to the upper magnetic field-establishing coil 24a to the electric current applied to the lower magnetic field-establishing coil 24c. In addition, when the electric current applied to the intermediate magnetic field-establishing coil 24b is gradually increased, the diameter of the resulting annular magnetic neutral loop decreases and the gradient of the magnetic field observed at the zero magnetic field position is simultaneously reduced gently and gradually. An antenna 26a for the generation of a high-frequency electric field is positioned between the intermediate magnetic field-establishing coil 24b and the cylindrical side wall 23c. The antenna is connected to a high-frequency power source 26b to constitute an electric field-generating means. In this way, an NLD plasma can thus be generated along the annular magnetic neutral loop formed by the three magnetic field-establishing coils 24a, 24b and 24c.

Within the substrate processing compartment 23b, a substrate electrode 27 is provided on an insulating material 28. The substrate electrode 27 has a circular cross-section and serves as a substrate-mounting part on which a substrate S to be processed is positioned in such a manner that the substrate faces the plane formed by the annular magnetic neutral loop. The substrate electrode 27 is connected to the second high-frequency power source 29b through a condenser 29a and serves as a floating electrode from the viewpoint of the electric potential to thus act as a negative bias voltage.

A roof or lid 23d arranged at the top of the plasma-generation compartment 23a is tightly fitted to the upper portion of the cylindrical side wall 23c to constitute a counter electrode which is potentially in a floated condition. A gas-introduction means 30 is arranged on the inner wall of the roof for introducing an etching gas into the chamber 23. The gas-introduction means 30 is connected to a gas source (not shown) through a gas flow rate-controlling means (not shown). When subjecting a thin film to etching in the etching apparatus 21 having such a construction, while introducing Ar and an etching gas (such as $C_3F_7I$ gas) into the apparatus, a pattern free of striation can be formed.

The following detailed description of a model process of a semiconductor device-manufacturing method, which extends from a transistor-manufacturing step to a Cu-electrical connection-forming step according to the single damascene technique as an application of the semiconductor device-manufacturing method according to the present invention, is illustrated in FIGS. 3 to 10. Several steps such as those for washing and measurement are present between every successive two steps, but the detailed description thereof will hereunder be omitted since these steps do not constitute any essential part of the present invention.

As shown in FIG. 3(a), a silicon wafer 31 is provided and then heated to a temperature of about 900° C. in a known oxidation furnace. An oxide film or an $SiO_2$ film 32 is grown on the wafer surface to a thickness of about 10 nm as shown in FIG. 3(b). Subsequently, as shown in FIG. 3(c), an SiN film 33 is formed on the $SiO_2$ film 32 to a thickness of about 90 nm by treating the wafer in a known LP-SiN furnace maintained at about 800° C. Then a resist mask 34 carrying groove patterns, each having a width of 100 nm, is formed by ArF-photolithography.

The $SiO_2$ film 32 and the SiN film 33 covered with the resist mask 34 are etched using a halogenated carbon-containing compound gas (provided that the halogen is at least two members selected from the group consisting of F, I and Br; and that the ratio of at least one of I and Br is not more than 26% of the total amount of the halogen atoms as expressed in terms of the atomic compositional ratio) as shown in FIG. 3(d). The resist mask 34 is then removed through ashing to give a hard mask 32, 33 as shown in FIG. 3(e). At this stage, no striation is observed on the hard mask 32, 33. The silicon wafer 31, as an underlying material of the hard mask 32, 33, is further etched to form trench (groove) patterns 35, each having a width of 100 nm on the silicon wafer 31 as shown in FIG. 3(f). The resulting trench patterns 35 are likewise free of striation because of the smoothness of the hard mask 32, 33 carrying desired patterns to be transferred.

The silicon wafer 31 on which the foregoing trench patterns 35 have been formed is heated to a temperature of about 900° C. to oxidize the wafer. The trench patterns 35 are filled with HDP (High Density Plasma)-$SiO_2$ film 41 at a temperature of about 400° C. as shown in FIG. 4(a). Thereafter, the silicon wafer is subjected to the known HDP-CMP (Chemical Mechanical Polishing) to make the surface thereof smooth (FIG. 4(b)) and then to an oxidation step carried out at about 850° C. An SiN-removal step is performed using, for instance, a known ICP etcher. Then the silicon wafer is subjected to an oxide film-removing step using a diluted hydrofluoric acid (HF) solution as shown in FIG. 4(c) to form a silicon wafer 31 having a flattened surface and an STI structure 35a.

As shown in FIG. 4(d), a gate oxide film 42 is grown on the silicon wafer 31 by an oxidation step carried out at about 850° C. A polysilicon film 43 is then grown on the gate oxide film to a thickness of 150 nm using the known CVD technique as shown in FIG. 4(e). A W film 44 is further grown on the polysilicon film to a thickness of about 200 nm to form a laminate film for forming gate electrodes. Finally, a PE-TEOS (tetraethoxy silane)-$SiO_2$ film 45 for a hard mask is formed to a thickness of 200 nm.

As has been shown in FIG. 4(f), a gate electrode pattern 46 is formed in a gate-lithography step using ArF-photolithography. The resist mask 46 carrying the pattern is used for etching the TEOS-$SiO_2$ film 45 until the thickness-reduction thereof reaches 300 nm including the 50% over-etching while using the foregoing halogenated carbon-containing compound gas (provided that the halogen is at least two members selected from the group consisting of F, I and Br; and that the ratio of at least one of I and Br is not more than 26% of the total amount of the halogen atoms ex as in terms of the atomic compositional ratio) and using an etching apparatus as shown in FIG. 2 to form a hard mask 45 as shown in FIG. 4(g). This etching step for forming a hard mask is free of the generation of any striation and, therefore, permits the production of a hard mask 45 having a quite smooth shape.

As shown in FIG. 5(a), the W film 44 and the polysilicon film 43 are subjected to a gate-etching step in which these films are etched using the known ICP etcher to complete gate electrodes 51. The resist pattern 46 is etched out during the etching step. Moreover, the hard mask 45 formed according to the method of the present invention, while restricting the generation of any striation, is used for the transfer of the patterns of the gate electrodes 51. Accordingly, striations are not observed in the resulting gate electrodes 51.

A further oxide film is grown at a temperature of about 850° C. Shallow implanted LDDs 52 (lightly doped drain) for source drains (SD) are formed by using ion implantation of As ($1\times10^{15}/cm^2$).

Thereafter, an SiN film 53 is grown by the PE-CVD process at about 400° C. as shown in FIG. 5(b). A side wall 53c, as shown in FIG. 5(c), is formed using the RIE (reactive ion etching) technique. This side wall 53c is used as a mask to perform an ion-implantation of As ($5\times10^{15}/cm^2$), followed by annealing at 850° C. for 30 minutes to form source drains 54.

A PE-SiN film 55 is grown to a thickness of about 100 nm as shown in FIG. 5(d). A BPSG (boro-phospho silicate glass) film 56 is then grown to a thickness of 700 nm as shown in FIG. 5(e), followed by annealing the wafer at a temperature of 800° C. The BPSG film 56 is polished by the application of known ILD-CMP until almost all of the projections present thereon are removed to give a flattened first interlayer dielectric film 56a as shown in FIG. 6(a).

As shown in FIG. 6(b), a TEOS-$SiO_2$ cap film 61 is grown at about 400° C. on the flattened dielectric film 56a using CVD. A resist mask 63 formed by ArF-photolithography carries a pattern 62 of contact holes each having a diameter of about 100 nm as shown in FIG. 6(c). The TEOS-$SiO_2$ film 61 covered with the resist mask 63 is etched with the halogenated carbon-containing compound gas without any accompanying striation. The underlying BPSG film 56a, the PE-SiN film 55 and the gate oxide film 42 are likewise etched to form contact holes 64 as shown in FIG. 6(d).

The resist mask 63 is removed using a known ashing method. A barrier metal layer 71 of TiN is formed by CVD to a thickness of about 20 nm as shown in FIG. 7(a). A CVD-W film 72 is deposited to a thickness of about 50 nm to fill up the contact holes 64 with this W film as shown in FIG. 7(b). Subsequently, the excess of the W film is removed through polishing according to the known W-CMP technique. The barrier metal layer 71 is used as a stopper. The barrier metal layer 71 is likewise removed to form tungsten plugs 73 as shown in FIG. 7(c). These tungsten plugs can ensure the electrical connection between the source drains 54 and the gate electrodes 51. Incidentally, the contact plugs for the gate electrodes 51 are not depicted on this figure.

The method for forming Cu electrical connections on the transistor produced by the single damascene technique will be detailed below. As has been shown in FIG. 7(d), a PE-SiN cap film 74 is first grown at a temperature of about 400° C. to a thickness of about 50 nm by the known plasma CVD technique.

Similarly, TEOS-SiO$_2$ film 81 is deposited to a thickness of about 250 nm by plasma CVD. A PE-SiN film 82 is then grown to a thickness of 50 nm in the same manner as the PE-SiN film 74 as shown in FIG. 8(a). Subsequently, an ArF resist film 84 carrying electrical connection patterns 83 is formed in a thickness of about 200 nm using ArF-photolithography. The electrical connection patterns 83 are fine electrical connections, each having a connection width and/or a space between the neighboring connections of not more than 130 nm, and the connection width and/or the space may be not more than 100 nm to achieve the further miniaturization of the size of the electrical connection.

Then the pattern of this ArF resist mask 84 is transferred to the PE-SiN film 82 by subjecting the film 82 to dry-etching through the resist mask using the halogenated carbon-containing compound gas according to the present invention (FIG. 8(b)) without generation of striations. The etching is continued until the underlying TEOS-SiO$_2$ film 81 is also etched out as shown in FIG. 9(a). Thus, the electrical connection patterns are formed on the interlayer dielectric film 81 as a pattern of grooves each provided with smooth side walls without striations.

Thereafter, the resist mask 84 is removed by the use of a usual microwave asher. Etching of the SiN is performed using an ICP etching apparatus to remove the SiN film 74 from the bottom of the grooves 83a to form electrical connections as shown in FIG. 9(b).

A TaN film is deposited to a thickness of about 10 nm and thereafter a Ta film is likewise deposited to a thickness of about 15 nm by sputtering to form a barrier metal film 101 as shown in FIG. 10(a). A Cu film 102 is deposited to a thickness of about 1 μm by the Cu-plating technique. The device is subsequently annealed at a temperature of about 200° C. Any excess Cu film is removed through polishing by CMP while using the Ta film of the barrier metal film 101 as a stopping layer as shown in FIG. 10(b). Thus, the grooves 83a for the electrical connections or the patterns transferred from the resist mask 84 are filled with Cu 102b which will subsequently serve as the metal interconnection according to the damascene technique.

When using the Cu-electrical connection 102b according to the foregoing embodiment, the smooth groove pattern 83 formed by etching of the present invention can be filled up with the barrier metal film 101 and the Cu film 102. Therefore, the electrical connections are completely free of striation unlike the conventional Cu electrical connections 164 which have striations 165 as shown in FIG. 16. Accordingly, Cu of the electrical connections never undergoes diffusion into the interlayer dielectric film 81. Thus, the semiconductor device a according to this embodiment completely avoids the generation of any defects such as leakage between the neighboring electrical connections due to the Cu diffusion originating from striation 165 observed for the conventional Cu electrical connections 164. This is accomplished even in fine patterns whose line width and/or space between the neighboring electrical connections are not more than 130 nm. Therefore, the present invention permits the significant improvement of the semiconductor device manufacture yield.

The etching gas used in the present invention will hereunder be described in detail. As has already been described above, the present invention uses a fluorinated carbon-containing compound gas as a gas for etching a dielectric film. The gas contains at least one member selected from the group consisting of I and Br which can form quite stable compounds and, in themselves, function as etchants for Si. Examples of such fluorinated carbon-containing compound gases include iodinated and fluorinated carbon-containing compound gases or brominated and fluorinated carbon-containing compound gases and mixtures thereof which may be used alone or in combination.

These iodinated and fluorinated carbon-containing compound gases and/or brominated and fluorinated carbon-containing compound gases are hereunder represented by the general formula $C_n(Hal)_{2n+2}$ (in the formula, Hal means a halogen atom and n is a number ranging from 1 to 3). Preferably used herein are, for instance, at least one member selected from the group consisting of $CF_3I$, $CF_3Br$, $C_2F_5I$, $C_2F_5Br$, $C_3F_7I$, $C_3F_7Br$, $C_3F_6I_2$ and $C_3F_6Br_2$, or mixed gases each comprising at least two members selected from the group consisting of these fluorinated carbon-containing compound gases and HI or HBr. The use of such an etching gas wherein n is higher than 3 is not practical since a problem arises such that the interior of the chamber is contaminated during etching.

Moreover, usable herein as such etching gases also include, for instance, iodinated and fluorinated carbon-containing compound gases such as $C_2F_4I_2$ and brominated and fluorinated carbon-containing compound gases such as $C_2F_4Br_2$. In this case, $CF_4$ gas, or the like, is added to the etching gas so that the ratio of at least one of I and Br is not more than 26% of the total amount of the halogen atoms as expressed in terms of the atomic compositional ratio.

Furthermore, the etching gas may be a mixed gas comprising at least one of HI and HBr, and a perfluoro carbon-containing compound, such as tetrafluoroethylene, represented by the general formula: $C_n(Hal)_{2n}$ (in the formula, Hal means a halogen atom and n is a number ranging from 1 to 3). Examples of etching gases usable herein also include a mixed gas comprising $CF_3I$ and a perfluoro carbon-containing compound; and a mixed gas comprising $CF_3Br$ and a perfluoro carbon-containing compound.

The foregoing etching gas may likewise be a mixed gas comprising $CF_4$ gas and $C_2F_4I_2$ or $C_2F_4Br_2$; or a mixed gas comprising at least one of HI and HBr and a perfluoro carbon-containing compound; or a mixed gas comprising $CF_3I$ and a perfluoro carbon-containing compound; or $CF_3Br$ and a per carbon-containing compound.

In the present invention it is preferred to add oxygen gas to the etching gas in an amount ranging from about 3 to 15% on the basis of the total flow rate of the gas to be introduced into the etching chamber in order to prevent the filling up of the holes and/or grooves formed by the etching operations while adjusting the quantity of deposition of the reaction products during the etching procedures. In this case, if the amount of oxygen added to the etching gas is less than 3%, the desired effect of the present invention described above cannot be accomplished and the amount of the deposition cannot be controlled. On the other hand, if it exceeds 15%, the ArF resist would be damaged during etching.

Examples of the foregoing dielectric films to be etched using the foregoing etching apparatus 21 include films of oxides such as $SiO_2$, SiOCH-type materials formed by spin-coating such as HSQ and MSQ, SiOC-type materials formed by CVD, and SiOF-type materials likewise prepared by the CVD technique, which are Low-k materials each having a relative dielectric constant ranging from 1.5 to 3.7, including porous materials.

Examples of such SiOCH-type materials include one available from Catalysts & Chemicals Industries, Co., Ltd. under the trade name of NCS; one available from JSR Company under the trade name of LKD 5109r5; one available from Hitachi Chemical Co., Ltd. under the trade name of HSG-7000; one available from Honeywell Electric Materials Company under the trade name of HOSP; one available from Honeywell Electric Materials Company under the trade name of Nanoglass; one available from Tokyo Ohka Kogyo Co., Ltd. under the trade name of OCD T-12; one available from Tokyo Ohka Kogyo Co., Ltd. under the trade name of OCD T-32; one available from Catalysts & Chemicals Industries, Co., Ltd. under the trade name of IPS2.4; one available from Catalysts & Chemicals Industries, Co., Ltd. under the trade name of IPS2.2; one available from Asahi Chemical Industry Co., Ltd. under the trade name of ALCAP-S5100; and one available from ULVAC Company under the trade name of ISM.

Examples of such SiOC-type materials include one available from Nippon ASM Co., Ltd. under the trade name of Aurola2.7; one available from Nippon ASM Co., Ltd. under the trade name of Aurola2.4; one available from TRICON Company under the trade name of Orion2.7; one available from Novellus Company under the trade name of Coral; and one available from AMAT Company under the trade name of Black Diamond. In addition, usable herein as materials for the insulating films may likewise be, for instance, materials for forming organic-type low dielectric interlayer insulating films such as one available from Dow Chemical Company under the trade name of SiLK; one available from Dow Chemical Company under the trade name of Porous-SiLK; one available from Honeywell Electric Materials Company under the trade name of FLARE; one available from Honeywell Electric Materials Company under the trade name of Porous-FLARE; and one available from Honeywell Electric Materials Company under the trade name of GX-3P.

Now, a detailed description of the way to complete the present invention and the phenomenon of the present invention are given below. For instance, when etching a silicon oxide film in a plasma atmosphere while introducing an etching gas containing fluorocarbon ($C_xF_y$) gas into the plasma atmosphere under a working pressure ranging from 1 to 3 Pa using an inductively coupled type plasma (ICP) etching apparatus (not shown) (in this case, Ar plasma density is equal to about $1\times10^{11}$ cm$^{-3}$), a resist mask exposed to the plasma is significantly damaged making the edge portions thereof rough and causing deformation thereof (roughness of edge portion) (in general, referred to as "striation"). If the etching of the oxide film is continued while using a resist mask whose edge portion is roughened and deformed, the shape having such roughened and deformed edge portions is transferred to the holes and grooves being formed to cause striation of the resulting film.

When using the NLD apparatus 21 (which may be used in the present invention), the plasma discharge can be obtained even under a pressure (0.3-0.7 Pa) which is lower than the usual pressure (not less than 1 Pa). In this respect, the inventors of this invention have found that if etching is carried out using this NLD apparatus and an etching gas comprising $C_3F_8$ gas under such a low pressure, the occurrence of striation is able to efficiently be inhibited. In general, chemical species generated through the decomposition of $C_3F_8$ gas include, for instance, F, CF, $CF_2$, and $CF_3$, and the like. Molecular radicals other than F generally only weakly function as polymerization precursors and are poor for etching resists among the chemical species thus generated. For this reason, the inventors have concluded that F atoms thus generated would undergo reactions with the C=O groups and other functional groups of the resists to thus make the resist mask less-durable. The inventors of this invention have presumed that the use of a reaction capable of eliminating these F radicals would be quite effective in order to inhibit the occurrence of any striation.

In this connection, the inventors have found that when using $C_3F_7I$ as an etching gas instead of $C_xF_y$, the etching rate of the resist itself is reduced even when etching is carried out under the same pressure. The inventors have considered as follows: the reason why the etching rate of the resist itself is reduced is that the F radicals as an etchant for the resist mask undergo a reaction with I in the gas phase to thus form, for instance, $IF_3$, $IF_5$ and $IF_7$, to reduce or eliminate F radicals within the plasma etching atmosphere.

The following specific Examples are herein given for practically proving the foregoing consideration.

Example 1

In the present invention, in this Example, a dielectric film was prepared by growing (or depositing) an oxide film (TEOS-$SiO_2$) on a silicon substrate (wafer) to a thickness of 300 nm using TEOS gas by plasma CVD.

An anti-reflection film and then a resist film for ArF-photolithography were successively coated such that the dielectric film was covered with these films. An electrical connection pattern containing grooves each having a width of 100 nm was formed thereon while using ArF-photolithography. Thereafter, the dielectric film covered with the resist film carrying this electrical connection pattern was subjected to dry-etching within a plasma atmosphere.

During etching, the dielectric film was etched by introducing Ar and $C_3F_7I$ as an etching gas into the vacuum chamber 23 of the etching apparatus 21 at a pressure of 2.67 Pa to form grooves each having a width of 100 nm. The resist was then removed. At this stage, the flow rates of Ar, $C_3F_7I$ gas and oxygen gas were set at levels of 230 sccm, 50 sccm and 20 sccm, respectively. In addition, etching was carried out while setting the output of the high-frequency power source 26b connected to the high-frequency antenna coil 26a for the generation of the plasma used herein 1 kW, setting the output of the high-frequency power source 29b connected to the substrate electrode 27 at a level of 0.3 kW, and setting the substrate temperature at 10° C.

FIG. 11(a) shows an SEM image obtained viewing the conditions of the resulting grooves from the top surface of the substrate. A pattern 112a of grooves, each having a width of 100 nm, was formed on the dielectric film 111a smoothly. Silicon crystal as the underlying material was observed on the bottom of the groove pattern 112a. Thus, it has been observed that the striations generated within the grooves were limited to a size on the order of not more than 3 nm. Accordingly, it is clear that the present invention can inhibit the generation of defects due to such striations of the groove pattern for forming electrical connections. Thus, it was proved that the present invention could prevent the reduction of yield resulting from the defects due to such striations.

For the purpose of comparison with the conventional techniques, FIG. 11(b) shows an SEM image obtained viewing the conditions of the resulting grooves formed by the use of $C_3F_8$ in place of $C_3F_7I$ using the same apparatus under the same working conditions. In the conventional example, a pattern 112b of grooves, each having a width of 100 nm, was formed on the dielectric film 111b, but striations 113 were generated within the grooves. As a result, it was confirmed that the electrical connection width having a design value of 100 nm had a distribution equal to 100 nm±15%. In the conventional technique, the grooves 112b for forming electrical connections, wherein striations 113 are generated, are filled with a metallic electrical connection material without eliminating the striations. Therefore, the production yield accomplished in this connecting step would substantially be reduced due to, for instance, the diffusion of the Cu component.

Although, a $C_3F_7I$ gas was used as an etching gas in Example 1 described above, the same effect can be accomplished by the use of a $C_3F_7Br$ gas as an etching gas. There can be obtained a groove pattern free of any striation.

Example 2

Example 2 is given for the explanation of a method for forming a Cu electrical connection pattern of a semiconductor device according to the Cu-damascene technique. The following description of the basic or essential parts of a process is for forming only one layer, but two or more electrical connection layers can likewise be formed by repeating the following procedures or adding some modifications thereto (see, for instance, FIGS. 12(a) to (c)).

(1) First, a TEOS-$SiO_2$ film 122a was formed on an Si substrate 121 in a thickness of 250 nm at a temperature of 400° C. using plasma CVD. A cap-SiN film 122b was grown thereon to a thickness of 50 nm.

(2) An interlayer dielectric film 122c of TEOS-$SiO_2$ on which Cu-electrical connections would be formed was formed on the SiN film 122b in a thickness of 200 nm at a temperature of 400° C. using plasma CVD. A plasma silicon nitride film (p-SiN) 122d as a CMP stopper was deposited on the dielectric film 122c to a thickness of 30 nm at 400° C. using plasma CVD.

(3) A resist for ArF-photolithography (a product available from Shipley Company under the trade name of UV-6) was applied on the SiN film 122d. In this case, an anti-reflection coating (BARC available from Tokyo Ohka Kogyo Co., Ltd.) was applied onto the SiN film to prevent any reflection of light rays from the underlying layer. Then the resist for ArF-photolithography was applied onto the anti-reflection coating in a thickness of 300 nm.

(4) Electrical connection patterns having a width of 100 nm were transferred onto the resist film using a known ArF-photolithography apparatus.

(5) The electrical connection pattern was developed in the form of grooves.

(6) The SiN film 122d and the $SiO_2$ interlayer dielectric film 122c were etched in a thickness of 200 nm under the following process conditions to form grooves in the $SiO_2$ film 122c.

Etching gas: $C_3F_7I$ gas to which $O_2$ has been added and which has been diluted with Ar gas. For the purpose of comparison, Comparative Example was likewise carried out using $C_3F_8$ gas in place of $C_3F_7I$ gas.
Flow rate of Ar gas: 230 sccm
Flow rate of $C_3F_7I$ gas: 50 sccm (That of $C_3F_8$ gas in the Comparative Example was set at the same level)
Flow rate of $O_2$ gas: 20 sccm
Pressure: 2.67 Pa
Output of antenna high-frequency power source: 1 kW
Output of substrate high-frequency power source: 0.3 kW
Established substrate temperature: 10° C.

(7) The resist was removed by ashing.

(8) After washing, TaN film 123 was uniformly deposited within the grooves formed by the foregoing step to a thickness of 10 nm using sputtering.

(9) A Cu seed layer was sputtered onto the TaN film to a thickness of 30 nm. A known Cu-plating treatment was applied thereto to form a Cu film having a thickness of 500 nm.

(10) The Cu film was removed by polishing the same using CMP. In this case, the polishing operation was terminated at an instance when the surface of the SiN film 122d was exposed to form a desired Cu-electrical connection pattern 124.

(11) After washing the resulting assembly, the top face of the resulting sample was subjected to observation.

In this respect, FIG. 12(a) is a diagrammatic view of the cross-sectional structure of a sample obtained after the completion of the foregoing steps (1) to (11); FIG. 12(b) is a diagram of the top plan view of the sample; and FIG. 12(c) schematically shows the top plan view of the resulting Cu electrical connection cut along the line X-X in FIG. 12(a).

As is clear from FIG. 12(b), when the etching is carried out according to the present invention, no striation is found in the grooves, while striations 165 are generated in the grooves formed by the use of the conventional etching gas as shown in FIGS. 16(b) and (c). It has been found that if such a striation 165 is generated and the grooves are filled with a TaN film 163, the TaN film 163 does not sufficiently grow at the severely constricted portions. Instead, the TaN film 163 is too thin, or the TaN film 163 never undergoes any growth at such portions at all. The TaN film 163 functions as a barrier film for preventing the penetration and diffusion of the Cu into the interlayer dielectric film 162c. Therefore, if the functioning is insufficient, the resulting semiconductor device shows damaged characteristics to thus reduce the production yield thereof.

The assembly shown in FIG. 16(a) is cut along the line X-X and the cross-section of the electrical connection is observed from the top thereof. A portion of the cross-section including a striation 165 is expanded and schematically shown in FIG. 16(c). In contrast, the Cu-electrical connection formed in Example 2 according to the method of the present invention is free of striation as is clear from FIG. 12. Striations 165 are generated in the electrical connections formed according to the conventional method using $C_3F_8$ gas as shown in FIG. 16(b). It can be recognized that the Cu layer and the interlayer dielectric film 162c are almost brought into close contact with one another at the portion A appearing in FIG. 16(c).

In contrast, in Example 2 of the present invention, grooves can be formed without being accompanied by the generation of striation as is clear from FIG. 12. Therefore, the finished dimension of the electrical connections thus formed is almost constant throughout the device within the permitted limits, and no locally narrow portions are observed throughout the electrical connections.

When there is some local scattering in the line width of the electrical connection, the design value of the line width, has conventionally been set at a sufficiently large level so that the width of the narrowest portion is less than the design value. The present invention permits the design of the line width while leaving some surplus. Therefore, the tip may be so designed that it has a small size. Accordingly, the production cost can likewise be reduced as compared with the conventional technique and the present invention may win in competitive pricing.

Moreover, when sharp recesses are generated due to striations, the thickness of the barrier metal film (for instance, the TiN film and/or the TaN film) may partially be reduced and Cu may diffuse through the thinner portions of the film. Recesses are not generated throughout the barrier metal film in the pattern-transfer method according to this Example.

Accordingly, the resulting barrier metal film may have an improved reliability as a barrier to Cu-diffusion. The present invention permits the prevention of the occurrence of defects due to, for instance, the striation observed for the conventional electrical connections and this, in turn, permits the substantial improvement of the production yield of semiconductor devices a.

Alternately, when etching the interlayer dielectric film (film thickness: 200 nm) in the foregoing etching, it would likewise be conceivable that a mixed gas containing $C_3F_8$ gas and an I atom-containing compound such as HI can be used as an etching gas instead of $C_3F_7I$ gas. These components of the mixed gas react with one another within a reaction chamber before carrying out the etching to form the desired $C_3F_7I$ gas which is introduced into the vacuum chamber. Such a method can be practical from the technical standpoint and the achievement of the same effects described above can be expected. However, the number of parameters to be controlled increases. Accordingly, this method is rather unfavorable for the mass-production of the devices.

Example 3

Example 3 is given explaining the principal steps for accurately producing the gates included in the semiconductor device a according to the present invention. In this respect, FIGS. 13(a) to (c) and 13(a') to (c') schematically show respective cross-sectional views and top plan views of the semiconductor device obtained after the completion of these principal steps, respectively. In this connection, any known method can be used as, for instance, a dielectric isolation step of a transistor prior to the production of gates; a step for producing a gate-insulating film; a side wall-forming step after the etching of the gate-forming material; and a source and drain-diffusion step. Therefore, the description of these steps are herein omitted.

(1) A gate oxide film 132 was grown on a silicon (Si) wafer 131 to a predetermined thickness and a doped amorphous Si (a-Si) film 133a was then formed at 500° C. using known CVD to a thickness of 200 nm.

(2) A tungsten (W) film 133b was grown on this a-Si film 133a at 400° C. using CVD to a thickness of 200 nm.

(3) Then the resulting assembly was subjected to annealing at 700° C. for 30 minutes to form a film 133 for forming gate electrodes.

(4) A plasma oxide film 134 (TEOS-$SiO_2$) was grown as a hard mask on the foregoing tungsten film 133b at a temperature of 400° C. to a thickness of 200 nm.

(5) A resist 136 for the ArF-photolithography (a product available from Shipley Company under the trade name of UV-6) was applied on the hard mask 134. In this case, an anti-reflection coating (BARC) 135 was previously applied onto the hard mask to prevent any reflection of light rays from the underlying layer. The resist 136 was applied onto the anti-reflection coating in a thickness of 300 nm.

(6) A gate pattern having a width of 80 nm was transferred onto the resist film 136 using a known ArF-photolithography apparatus to form a resist mask carrying a gate pattern having a gate length of 80 nm as shown in FIG. 13(a).

Figure 15:
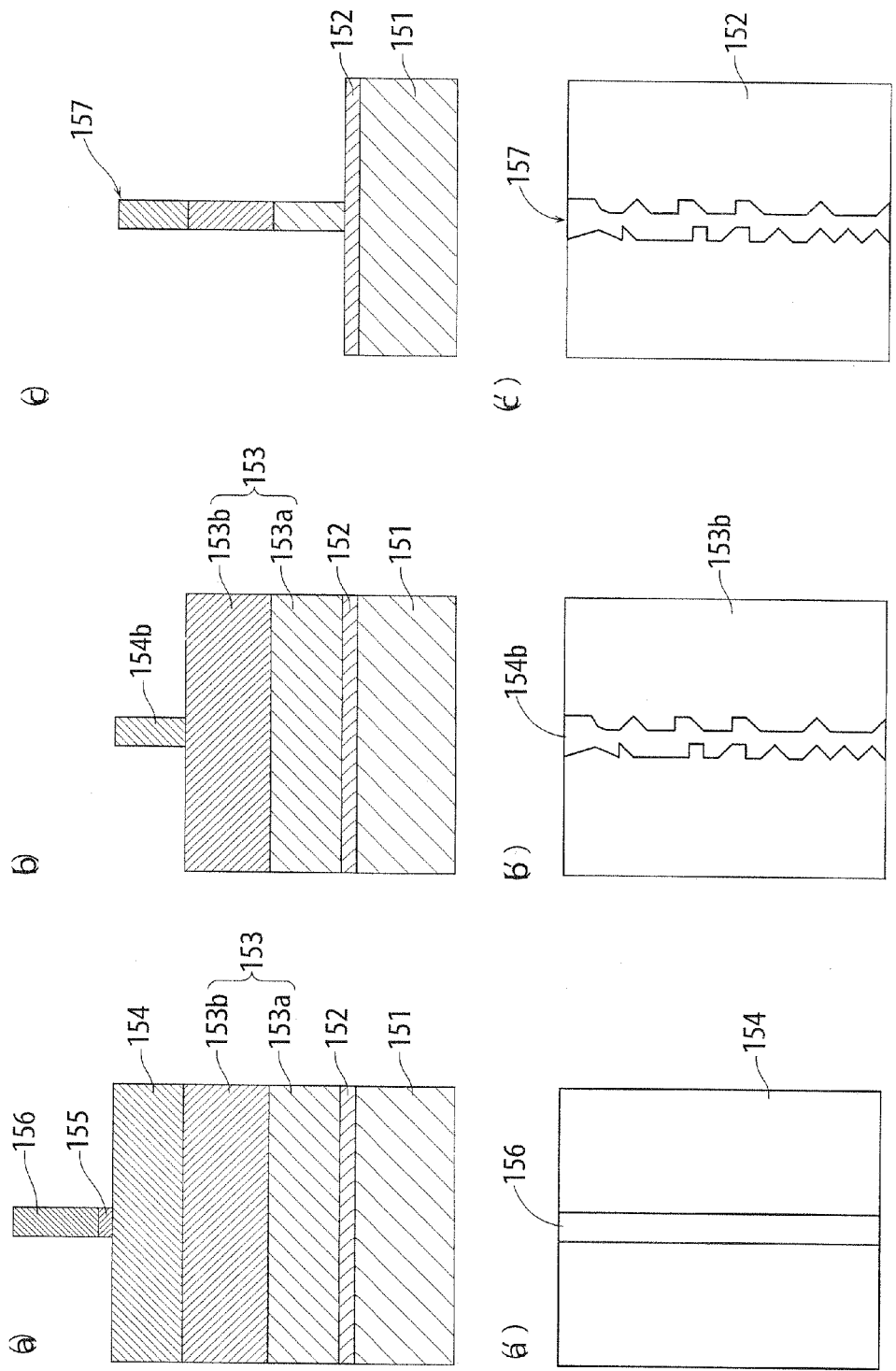
FIG. 15 shows the schematic cross-sectional views (a) to (c) and the schematic top-plan views (a') to (c') of a semiconductor device, illustrating a conventional method for the preparation of gates for transistors.

(7) Then, the plasma oxide film 134 was etched out to a thickness of 200 nm under the following process conditions:

Etching gas: $C_3F_7I$ gas to which $O_2$ has been added and which has been diluted with Ar gas. For the purpose of comparison, a comparative experiment (a conventional method, see attached FIG. 15) was likewise carried out using $C_3F_8$ gas in place of $C_3F_7I$ gas.

Flow rate of Ar gas: 230 sccm
Flow rate of $C_3F_7I$ gas: 50 sccm (That of $C_3F_8$ gas was set at same level)
Flow rate of $O_2$ gas: 20 sccm
Pressure: 2.67 Pa
Output of antenna high-frequency power source: 1 kW
Output of substrate high-frequency power source: 0.3 kW
Established substrate temperature: 10° C.

(8) The resist 136 and the anti-reflection coating 135 were removed (see FIG. 13(b)). At this stage, the resulting hard mask was found to be free of any striation having a size on the order of not less than 3 nm and had a smooth appearance.

(9) Then 200 nm of the W film 133b and 200 nm of the polysilicon film 133a were etched using HBr gas to form a gate electrode structure 137 as shown in FIG. 13(c).

(10) Finally, the assembly was washed and then again oxidized while leaving the hard mask 134b as it was.

In respect of the gate electrode structure 137 obtained after the completion of the foregoing steps (1) to (10), when forming the hard mask 134b, the pattern on the resist mask 136 was transferred onto the hard mask without causing any detrimental striation. Therefore, the gate electrode structure 137 was formed by transferring this pattern arranged on the hard mask 134b having smooth side walls through etching. Accordingly, the present invention permits the formation of a gate electrode structure 137 having a gate length almost comparable to its design value through the resist mask 136. The present invention can thus suppress the generation of any distribution of gate lengths Lg due to striation.

In Example 3, a known thermally oxidized film is used as the gate oxide film. However, a gate oxide film having a high dielectric constant (such as $HfO_x$) may be used. Moreover, the gate structure used herein is a laminate structure comprising an amorphous silicon film and tungsten film. However, the amorphous silicon film may be replaced with a polysilicon film, a single metal film (conductive film) containing tungsten (W), titanium (Ti), tantalum (Ta), cobalt (Co) or nickel (Ni). Further, the gate length is set at 80 nm in Example 3. However, the present invention can likewise be applied to finer patterns (applicable to a gate length of 50 nm or smaller) which are resolved by an immersion ArF photolithography technique or the electron beam lithography technique.

Regarding the pattern obtained by etching with the conventionally used $C_3F_8$ gas, the gate length distribution was evaluated measuring the shortest and longest gate lengths observed for a single gate and it was found to be ±15% [(maximum length−minimum length)×100/(maximum length+minimum length)] as shown in FIG. 15(c). In contrast, the pattern obtained in the present invention has a gate length distribution falling within the range of ±5% as shown in FIG. 13(c). Accordingly, the roughness of the edge portions was found to be less than 5 nm.

Accordingly, the present invention can provide a finished semiconductor device whose gate length Lg-distribution is low as compared with that observed for the conventional pattern since the formation of the pattern through etching is carried out according to the method which can control the generation of striation during etching operations. The use of the present invention permits the formation of smooth side faces in the production of a transistor which makes use of the side face of an Si crystal as a channel. A working Example thereof will hereunder be described.

Example 4

Example 4 is a description of a method for the preparation of channels for FIN-type transistors as the method for producing a semiconductor device according to the present invention.

FIGS. 14(a) to (e) and FIG. 14(a') to (e') show cross-sectional views and top plan views, respectively, schematically illustrating the method for the preparation of channels for FIN type transistors to which the present invention is applied. In the FIN-type transistor, the side face of an Si crystal is used as a channel. Therefore, if the etching of the Si crystal is accompanied by the generation of striation as has been observed in the conventional etching, a problem arises such that the characteristic properties of the resulting transistor would be greatly deteriorated because of surface reflection.

In Example 4, a thermally oxidized film 142 was grown on a silicon wafer 141 to a thickness of 100 nm as shown in FIG. 14(a). An anti-reflection coating 143 and then a resist film 144 for ArF-photolithography were formed. The resist film 144 was then formed into a desired pattern using ArF-photolithography to form a resist mask 144 carrying a fine pattern used for forming channels. In this respect, the fine pattern desirably has a width on the order of usually not more than 100 nm so that the channel voltage follows the gate voltage.

Then the thermally oxidized film 142 covered with the resist mask 144 was etched in a plasma atmosphere using the same process conditions used in Example 3 to form a hard mask 142b (FIG. 14(b)). At this stage, striations were not observed when the present invention was applied. Moreover, etching was continued using a mixed gas containing chlorine ($Cl_2$) and HBr as an etching gas capable of etching out the silicon to transfer the pattern present on the hard mask 142b onto the silicon wafer 141 (see FIG. 14(c)). Striations having a size of not less than 3 nm were not observed even on the silicon wafer carrying the pattern transferred from the hard mask 142b.

The hard mask 142c was removed by dissolving the same in a dilute hydrofluoric acid solution having a concentration of about 0.5% to yield a FIN-type channel 141d as shown in FIG. 14(d). The silicon wafer 141 carrying the pattern of the FIN-type channel 141d was subjected to thermal oxidation to form a gate oxide film 145. Thus, the FIN-type channel 141d was produced. Thereafter, a FIN-type transistor is completed by forming gate electrodes of, for instance, polysilicon on the FIN-type channel 141d according to any known method. In this respect, there have been known a variety of methods for forming gate electrodes. Therefore, the explanation thereof is herein omitted.

Thus, the present invention permits the formation of smooth and fine lines 141d on a silicon crystal 141 without being accompanied by the generation of striation on the side faces of the crystal. Therefore, the invention permits the highly precise control of the FIN-type transistor which makes use of the side wall as the channel of the transistor.

The present invention can be used as a memory device selected from DRAM and flash memories, a logic device, a system LSI, or a semiconductor device which comprises these elements and/or devices in a part thereof. The present invention is likewise used as a method for manufacturing these elements and/or devices.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than by the foregoing description, and all changes which come within the meaning and range of equivalency of the claims are, therefore, to be embraced therein.

What is claimed is:

1. A semiconductor device that comprises:
   a thin film provided thereon with patterns which are transferred onto the film by subjecting the thin film covered with a resist mask carrying an original of the patterns formed using ArF-photolithography to dry-etching within a plasma atmosphere,
   wherein the thin film has patterns in which at least one of the width of each pattern and the space between neighboring two patterns ranges from 32 to 130 nm and the dry-etching uses a halogenated carbon compound gas as an etching gas, wherein the halogen is at least two members selected from the group consisting of F, I and Br; and
   the ratio of at least one of I and Br is not more than 26% of the total amount of the halogen atoms as expressed in terms of the atomic compositional ratio.

2. The semiconductor device as set forth in claim 1, wherein the thin film is an electrical insulating film and the device is further provided with a metal electrical connection which is formed by filling the transferred patterns with a metal electrical connection material using a damascene technique.

3. The semiconductor device as set forth in claim 2, wherein the electrical insulating film is composed of a material containing either C or N and the relative dielectric constant thereof is not less than 1.5 and not more than 3.7.

4. The semiconductor device as set forth in claim 1, wherein the semiconductor device is a memory device selected from DRAM and flash memories, a logic device, a system LSI, or a semiconductor device which comprises these elements and/or devices in a part thereof.

5. A semiconductor device provided with a portion to which a pattern is transferred by subjecting a thin film covered with a resist mask carrying an original for the pattern formed using ArF-photolithography to dry-etching within a plasma atmosphere to form a hard mask and then etching through the hard mask to transfer the pattern present on the hard mask onto a semiconductor device,
   wherein the desired pattern to be transferred to the foregoing portion is first transferred to the hard mask from the resist mask by etching carried out using a resist mask carrying patterns in which at least one of the width of each pattern and the space between neighboring two patterns ranges from 32 to 130 nm and using a halogenated carbon compound gas as an etching gas, wherein the halogen is at least two members selected from the group consisting of F, I and Br; and
   the ratio of at least one of I and Br is not more than 26% of the total amount of the halogen atoms as expressed in terms of the atomic compositional ratio, and the pattern is then transferred from the hard mask to the semiconductor device.

6. The semiconductor device as set forth in claim 5, wherein the portion to which a pattern is transferred is a film for forming gate electrodes or an Si substrate.

7. The semiconductor device as set forth in claim 6, wherein the film for forming gate electrodes consists of a conductive film containing W, Ti, Ta, Co or Ni or a polysilicon film or a laminate film comprising the conductive film and a polysilicon film.

8. The semiconductor device as set forth in claim 5, wherein the semiconductor device is a memory device selected from DRAM and flash memories, a logic device, a system LSI, or a semiconductor device which comprises these elements and/or devices in a part thereof.

9. An etching apparatus for subjecting a thin film covered with a resist mask carrying patterns formed by ArF-photolithography to etching in a plasma atmosphere, comprising:
  a gas-introduction means connected to a gas source through a gas flow rate-controlling means, the apparatus being constructed as to introduce an etching gas into a chamber through the gas introduction means while etching the thin film covered with a resist mask carrying patterns in which at least one of the width of each pattern and the space between neighboring patterns ranges from 32 to 130 nm, wherein:
  the etching gas comprises a halogenated carbon compound gas;
  the halogen comprises at least two members selected from the group consisting of F, I and Br; and
  the rate of at least one of I and Br is not more than 26% of the total amount of the halogen atoms as expressed in terms of the atomic compositional rate.

* * * * *